(12) United States Patent
Salinger

(10) Patent No.: US 6,252,912 B1
(45) Date of Patent: Jun. 26, 2001

(54) ADAPTIVE PREDISTORTION SYSTEM

(75) Inventor: Sheldon N. Salinger, Los Altos, CA (US)

(73) Assignee: General Dynamics Government Systems Corporation, Mountain View, CA (US)

( * ) Notice: Subject to any disclaimer, the term of this patent is extended or adjusted under 35 U.S.C. 154(b) by 0 days.

(21) Appl. No.: 08/997,858

(22) Filed: Dec. 24, 1997

(51) Int. Cl.$^7$ .................................................. H04L 27/10
(52) U.S. Cl. ......................... 375/278; 375/285; 375/297
(58) Field of Search .................................. 375/261, 278, 375/284, 285, 296, 297; 455/63, 126

(56) References Cited

U.S. PATENT DOCUMENTS 4,980,897  12/1990  Decker et al. ........................ 375/38

OTHER PUBLICATIONS

Suzuki, T., Takatori, H., Ogawa, M. and Tomooka, K., "Line Equalizer for a Digital Subscriber Loop Employing Switched Capacitor Technology," IEEE Trans. on Communications, vol. COM–30, No. 9, pp. 2074–2082, Sep. 1982.
Agazzi, O., Tzeng, C.–P.J., Messerchmitt, D.G., and Hodges, D.A., "Timing Recovery in Digital Subscriber Loops," IEEE Trans. on Communications, vol. COM–33, No. 6, pp. 558–569, Jun. 1985.
Gardner, F.M., "A BPSK/ZPSK Timing—Error Detector for Sampled Receivers," IEEE Trans. on Communications, vol. COM–34, No. 5, pp. 423–429, May 1986.
Meyers, M.H., "Robust Control of Decision Directed Loops," IEEE CH2655–9/89/0000–1030–1036, Sep. 1989.
Sari, Hikmet, and Said, Moridi, "New Phase and Frequency Detectors for Carrier Recovery in PSK and QAM Systems", IEEE Trans. on Communications, vol. 36, No. 9, pp. 1035–1043, Sep. 1988.
Sari, H., Desperben, L., and Moridi S., "A New Class of Frequency Detectors for Carrier Recovery in QAM Systems", IEEE CH2314–3/86/0000–0482, pp. 482–486, 1986.
Brown, R., Sorbaba, M., Wang, T., Segev R., Van Kerkhove, J.F., Mildonian, H., Hall, C., Zimmerman, G., Martinez, K., Mullaney, K., Zain, I., Young B., Gleichauf, P., Hohhof, K., "Draft Interface Specification for a CAP Based RADSL System", Jul. 22, 1996.
Karam, G., and Sari, H., "A Data Predistortion Technique with Memory for QAM Radio Systems", IEEE Trans. on Communications, vol. 39, No. 2, pp. 336–344, Feb. 1991.

Primary Examiner—Don N. Vo
(74) Attorney, Agent, or Firm—Jenner & Block, LLC

(57) ABSTRACT

A method and apparatus are described for adaptively predistorting a signal before it is transmitted by a transmitter in order to compensate for nonlinearities which are introduced. Statistical information regarding the received signal is accumulated at a receiver, and is preferably transmitted back to the transmitter for processing. The processing includes a constellation analysis to determine the distortion characteristics of the signal, which may include bias, gain imbalance, lock and quad angle errors, and nonlinear distortions including AM-AM and AM-PM conversion effects, with all of these phenomena occurring anywhere in the transmitter-channel-receiverchain. From analysis of the statistics of the distortions in the received signal constellation, adjustments are made in the transmitter and/or receiver parameters. The positions of the signal symbols in the transmitted constellation are thereby correctively predistorted to compensate for and ameliorate the distortions in the received signal, thereby improving the fidelity of the said received signal.

54 Claims, 7 Drawing Sheets

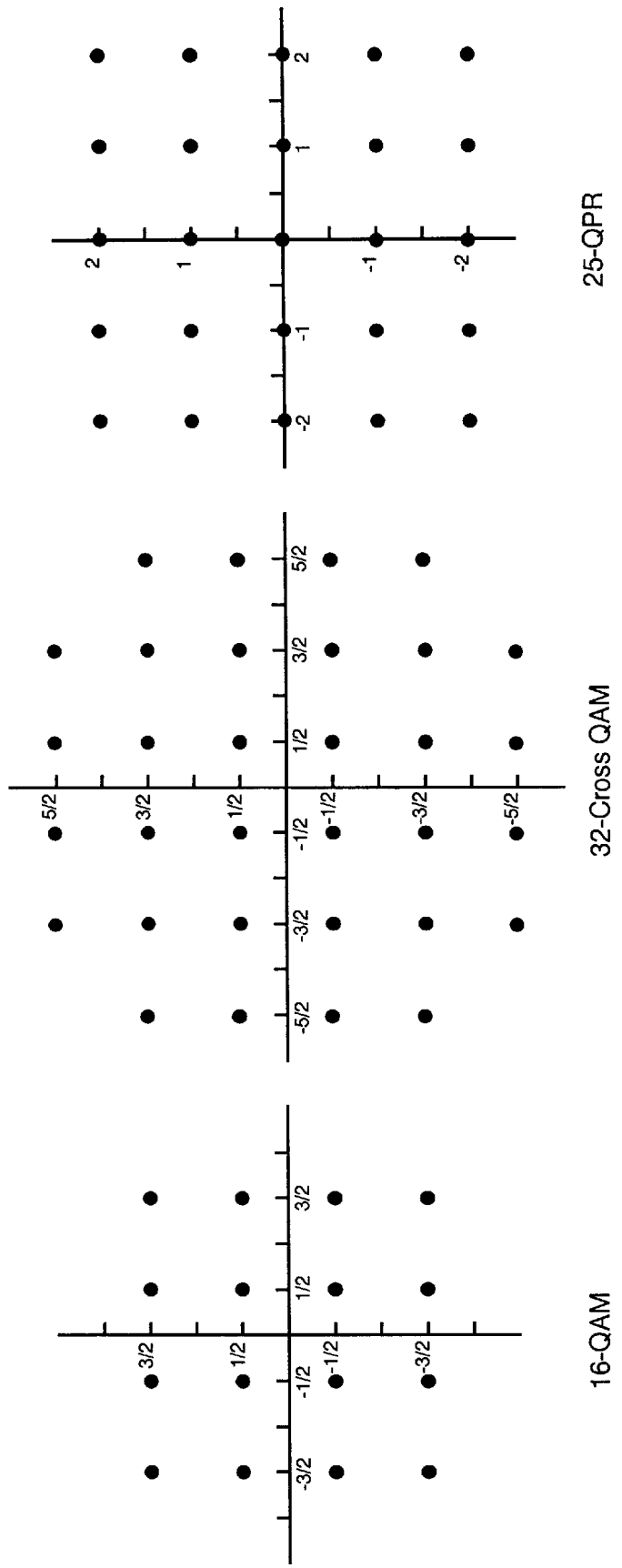

b. Negative Lock Angle Error a. Positive Lock Angle Error b. Positive Quad Angle Error a. Negative Quad Angle Error

ADAPTIVE PREDISTORTION SYSTEM

FIELD OF THE INVENTION

The present invention generally relates to the field of data communications. More specifically, the present invention is for a method and apparatus for adaptively predistorting a signal before it is transmitted from a transmitter to a receiver of a communication system.

BACKGROUND OF THE INVENTION

Digital data communications systems are commonly used to transmit and/or receive data between remote transmitting and receiving locations. A central facet of any data communications system is the reliability and integrity of the data which is being communicated. Ideally, the data which is being transmitted from the transmitting location should be identical to the data which is being received at the receiving location. Practically however, the data which is received at the receiving location has oftentimes been corrupted with respect to the original data that was transmitted from the transmitting location. Such data communication errors may be attributed in part to one or more of the transmission equipment, the transmission medium or the receiving equipment. With respect to the transmission medium, these types of data errors are usually attributed to the less than ideal conditions associated with the particular transmission medium.

For example, in the case of wireless communication systems, the transmission medium, which is typically air, often suffers from atmospheric and othere effects that tend to degrade the data being transmitted. Some of these non-ideal conditions may be modeled and taken into account in order to compensate for and thereby reduce or possibly eliminate any deleterious effects resulting therefrom. In this respect, it is generally known that signal attenuation is a function of the distance that the data signal must propagate through the atmosphere. Thus, it is possible to design a wireless communications system which is capable of transmitting a data signal sufficiently robust such that in spite of known distance-dependent atmospheric attenuation, the data signals at the receiving location can be properly and accurately received. Other types of non-idealities associated with an air or atmospheric transmission medium are often highly random events which may not be modeled a priori and thus may not be compensated for or eliminated.

The transmission of data over interconnecting wires also suffers from several noise and attenuation phenomena. For example, wires exhibit frequency dependent attenuation characteristics. Additionally, wires are subject to thermal or other types of noise.

To overcome these problems, data communications systems often rely on error detection and error correction schemes, to detect the occurrence of a data error and to correct a data error, respectively. One simple form of error detection is the use of a parity bit associated with each block of data to indicate whether the particular block contains an odd or even number of 1 bits. However, this is a very simple scheme which has numerous disadvantages. It is a simple type of error detection scheme which is capable of accurately detecting up to one bit error per data block. Moreover, the use of a parity bit cannot detect the occurrence of two bit errors in a data block, since this is not even detected as a parity violation. Additionally, the use of a parity bit only detects errors; it cannot correct errors. Any time that an error is detected, the receiving location typically requests retransmission of the particular data block from the transmitting location.

One type of error correction scheme commonly used in data communications systems is the use of redundant data transmissions and a voting circuit at the receiving location. In such a system, the data being transmitted is repeated a number of times, such as five. At the receiving location, all five data blocks are received and processed by a voting circuit which compares the five received versions of each data bit and determines the bit to be a 1 or 0 based on the voting consensus. Although such a system is capable of detecting and correcting data errors, it does so at a great cost in terms of the effective data throughput or transmission rate. This is due to the fact that each data block must be repeated a number of times.

Another type of error correcting scheme is the use of encoded data, such as trellis coded modulation (TCM). Trellis coded modulation involves the use of forward error correction in a transmitter and corresponding decoding in a receiver to correct data errors which occur during transmission. The signal transmitted by the transmitter includes some form of memory or history so that a current signal is dependent on previous signals. This is achieved by limiting the choices for a next possible signal based on the current and previous signals. In this way, by knowing a sequence of previously received signals, the receiver obtains some assistance in determining the authenticity of a currently received signal. At the receiver, the sequence information of the received signals is used to select a next signal most likely to have been transmitted. Both the transmitter and receiver know the predetermined, limited choices for a next signal based on the previous signals. Thus, even if a signal gets corrupted during transmission, the receiver may be able to still identify the correct, intended signal. One type of TCM method is disclosed in U.S. Pat. No. 4,980,897 to Decker et al., entitled MULTI-CHANNEL TRELLIS ENCODER/DECODER, the contents of which are incorporated herein by reference.

The above-mentioned correction/detection schemes are examples of binary block codes. Specifically, an (n,k,d) binary block code is a set of $2^k$ binary codewords of block length n and minimum distance d (i.e., coding distance). The transmitted data is partitioned into binary blocks of length k, then each block is mapped into a binary codeword of length n, which is then modulated and transmitted through the channel. This block code is capable of correcting up to $t=(d-1)/2$ errors within each codeword.

Different types of data transmission formats are susceptible to different types of attenuation and distortion. Narrowband transmission formats such as frequency shift keying (FSK) or amplitude shift keying (ASK) are somewhat immune to frequency dependent attenuation, and thus may suffer little or no distortion. However, the entire band of the narrowband signal may fall into an attenuation null and be severely attenuated. Wideband transmission formats such as spread spectrum are less susceptible to the signal degradation caused by a narrowband attenuation null. However, due to the wider bandwidth associated with a spread spectrum signal, the spread spectrum signal experiences more distortion due to frequency dependent attenuation. Thus, a conventional narrowband signaling format is susceptible to attenuation while a conventional wideband signaling format is susceptible to distortion.

Another type of signal enhancing approach is to compensate, by appropriate filtering of the received signal, for errors due to frequency dependent differences in attenuation, time delay, or both, introduced by either the transmitter, the transmission medium and/or the receiver. In this way, the deleterious effects, such as intersymbol interference which causes bit errors, are eliminated and the received signal is restored to its original level and quality. This approach is generally referred to as equalization.

In most practical cases, the channel characteristics are unknown and may vary with time. Hence, the equalizer must be updated with each new channel connection, as in the case of a voice-band modem operating in a switched network, and must also adapt the filter settings automatically to track changes in the channel with time. There are two general types of equalizers. In preset equalizers, a training sequence of data bits is transmitted and compared at the receiver with a locally generated sequence. The resulting error voltages are used to adjust the equalizer filter tap gains to optimum settings (which result in minimum distortion). In adaptive equalizers, the tap gain adjustments are derived directly from the transmitted data bits via decision directed feedback of the equalizer output errors, to minimize these output errors.

In one form of preset equalization, using a training sequence which is repeatedly transmitted from the transmitter to the receiver by way of the distorting communication channel, a set of parameters is established and used to emulate the effects of the distorting communication channel. Such a system is disclosed in U.S. Pat. No. 5,285,474 to Chow et al., entitled METHOD FOR EQUALIZING A MULTICARRIER SIGNAL IN A MULTICARRIER COMMUNICATION SYSTEM, the contents of which are incorporated herein by reference. The disclosed process is an iterative process which is repeated until a predetermined convergence condition is met. Convergence is determined by comparing the equalized received signal (using the estimated parameters) with a local replica (at the receiver) of the training sequence.

An alternative to equalization is predistortion, in which the distortive characteristics of the transmitter and/or channel are measured, and opposite, compensating distortions are introduced into the data entering the transmitter, so that the net effect at the receiver is a signal that has no net distortions, thereby eliminating the message errors introduced by the naturally occurring distortions.

In digital communication systems, such as radio systems, a major source of signal degradation or nonlinear distortion is the high power amplifier (HPA) used at the transmitter. Most high power amplifiers generally have a linear operating region (at low power) which progresses into a nonlinear region (at higher output power). In most communication systems, in order to compensate for the losses and attenuation associated with the transmission medium, the transmitter is operated at a higher power level. However, operating at the higher power level introduces nonlinearities associated with the amplifier. One approach to eliminating the nonlinearities at higher power levels is to use a higher power amplifier; however, this results in a more complex and costly circuit design. Additionally, a higher power amplifier consumes more power, generates more heat and radio frequency interference (RFI), and occupies more circuit board space. In order to use the nonlinear operating region of the amplifier, and thus avoid the need for a higher power amplifier, some type of predistortion is used to compensate for the nonlinear effects introduced by the amplifier. One such approach is presented in Georges Karam and Hikmet Sari, "A Data Predistortion Technique with Memory for QAM Radio Systems", *IEEE Transactions on Communications*, Vol. 39, No. 2, February 1991, the contents of which are incorporated by reference herein.

Karam and Sari describe a technique for predistorting the in-phase and quadrature components of the location of each quadrature amplitude modulated (QAM) data symbol that is input to a nonlinear power amplifier in order to compensate for the warping of the constellation by the nonlinearity, and also to compensate for the spreading of the transmitted symbols into a dispersed cluster at each ideal constellation point, caused by intersymbol interference due to filtering of each transmitted symbol within the transmitter. This filtering causes the apparent constellation coordinates of each symbol to be somewhat varied by the values of preceding and following symbols. Since the input amplitude of each pulse is thereby altered, the amount of nonlinear distortion for pulses at any ideal symbol point also varies with the values of the preceding and following symbols. If each symbol in an M-point constellation is considered to be affected by L preceding and L following symbols, i.e., by K=2L+1 symbols including itself, then each constellation point may take on $M^{K-1}$ different predistorted values. A memory must be provided to store the required predistortion for each of these values. Since the size of this memory becomes impractically large for large constellations, Karam and Sari recommend a technique in which quadrant symmetry and partitioning of the ideal symbol points into groups are used to reduce the total memory requirement. They show that significant predistortion processing gain can be achieved for up to 256-QAM (and possibly higher) modulations with reasonable memory requirements.

Although Karam and Sari's technique functions to compensate for transmitter nonlinearities, including both AM-AM (amplitude input distortions cause amplitude output distortions) and AM-PM (amplitude input distortions cause phase output distortions) conversion, it does not at all address the many types of distortions that can occur in the transmission channel and the receiver, many of which are time-varying, and all of which can affect the output symbol error rate. These distortions include offset biases, in-phase/quadrature gain mismatches, lock angle errors, quad angle errors, nonlinear distortions, phase noise, multipath, interference, and crosstalk.

There are two other limitations of the Karam-Sari technique described above. First, the technique presumes that the nonlinear gain and phase characteristics of the HPA remain invariant, so they can be measured and modeled initially, and then the measured scaling coefficients can be stored in memory to be used to appropriately predistort the input data. In practice, HPA nonlinearity curves can change with time, due to the effects of component aging, voltage changes, and temperature and other environmental variations. Therefore, it is necessary to periodically check and recalibrate the HPA nonlinearity parameters. While this is possible at the originating transmitter, it is much more difficult, if not impossible, at remote repeaters and satellite transponders.

The second limitation of the Karam-Sari technique is that it requires knowledge of the in-phase and quadrature amplitudes of the symbols in the data stream at the input to the predistorter preceding the HPA. While this information is readily available at the originating transmitter, it is not so readily available at intermediate repeaters and transponders. There, the signals must first be demodulated and the in-phase and quadrature amplitudes of the symbols must be measured for input to the predistorter memory. The predistorted signals must then be remodulated for input to the HPA. These steps can add a significant penalty in added equipment size, weight, power, and cost, especially in the case of satellite transponders.

SUMMARY OF THE INVENTION

The present invention provides an improved method and apparatus for adaptively predistorting a signal before it is transmitted. The adaptive predistortion of the present invention is accomplished at reduced complexity and cost, and is thus especially valuable in situations where the complexity and cost of the receiver must be kept as low as possible. The adaptive predistortion compensates for voltage offsets (biases), gain mismatches, lock and quad angle errors, and channel and receiver nonlinearities. Multipath and frequency-dispersive channel effects may be compensated for by using an adaptive equalizer following the receiver. In some systems, interference and crosstalk may be minimized by tuning the transmitter to carrier frequencies where these phenomena are minimized.

According to the present invention, the receiver accumulates certain statistics regarding the data sample values in each received symbol cluster in the signal's amplitude-phase constellation. These statistics are then sent via a low data rate reverse control channel to a processor at the transmitter where control parameters and symbol predistortion values are calculated. Distortion phenomena controllable by predistortion are then corrected in an adaptive predistorter following a memory-based predistorter at the transmitter. For phenomena that are most easily corrected at the receiver, the control parameters, which were computed using a data processor at the transmitter (to lower receiver cost), are sent to the receiver over a low data rate forward control channel. Alternatively, the calculations on the statistical information accumulated at the receiver may be carried out at the receiver itself.

Information is expressed digitally in bits (0s and 1s in the binary number system). The rate R at which bits can be transmitted over a channel of a given bandwidth W is constrained by Shannon's channel capacity theorem. By using multiple signal phases and amplitudes for transmitting k information bits per symbol (per waveform), the bandwidth efficiency R/W is increased in proportion to $k=\log_2 M$, where M is the number of distinct symbols in a given coordinate. A two-dimensional constellation of unique symbols, each representing a unique sequence of bits, may be formed by quadrature amplitude modulation (QAM), in which waveforms with two orthogonal phases (denoted in-phase and quadrature) are assigned one of M possible amplitudes in each coordinate. M is usually taken as a power of two, and the symbol amplitudes in each coordinate are usually equally spaced and symmetric about the origin. If M is an even power of two, we obtain a square QAM constellation. If M is an odd power of two and some corner symbol positions are eliminated, we obtain what is called a cross QAM constellation. For quadrature partial response (QPR) coding, M is not a power of two, but is instead an odd integer. The constellations used in carrierless AM/PM (CAP) modulation look like those of the modulation schemes discussed above, however, they are formed at baseband without modulation onto a carrier wave. The invention described herein can be applied to all these types of signals. With minor modifications, the present invention can also be applied to circular phase-shift keyed constellations and other constellations with symbols arranged on a non-square grid, and extensions to these constellation types are incorporated within the scope of this invention.

A demodulator is used to determine which symbol was transmitted by dividing the constellation region into cells with boundaries equally spaced between adjacent ideal symbol locations. Comparison of the coordinates of the received symbol with the cell boundaries identifies the received symbol. The receiver then translates the identified symbol into the corresponding bit sequence associated with that symbol. Noise, intersymbol interference (ISI), and multipath will cause the positions of the received symbols to be smeared into dispersed clusters centered on the ideal coordinates of the transmitted symbols. Other impairments, such as biases, gain imbalances, lock and quad angle errors, and nonlinear effects, will shift the centers of the received symbol clusters from their ideal locations in predictable manners. If the position of a received symbol is shifted away from its ideal location, due to any of these effects, by more than the distance to the nearest cell boundary in the direction of shift, then the receiver will determine the symbol to be in other than the correct cell. The symbol will then be misidentified and the transmitted bit stream will be incorrectly decoded. It is the purpose of this invention to assure that distortions of the constellation, which can shift the received symbols relative to the receiver's decision boundaries, are minimized, thereby minimizing the decoded bit error rate (BER). Of course, purely random noise effects are not thereby mitigated and still set a limit on the minimum achievable BER.

The analysis of the received signal is performed using constellation analysis (discussed in detail below). The constellation analysis is performed on statistical data concerning the received signal, which is measured at the receiver. The constellation analysis, which may be performed at either the transmitter or the receiver, yields the distortion characteristics of the received signal. This information is then provided to the transmitter in order for the transmitter to appropriately compensate the outgoing signal before it is transmitted. It is generally more advantageous to compensate the signal at the transmitter, rather than at the receiver, because by the time the signal is received at the receiver, the signal may not be recoverable. Although the calculations may be performed at either the transmitter or the reciever, when minimizing the cost of the receiver is important, it is better to process the statistical data for the constellation analysis at the transmitter. Nevertheless, distortions that are due to misadjustments of the receiver can best be corrected by sending readjustment commands to the receiver to correct the receiver parameters that are causing these distortions.

The present invention will become more apparent from the following Brief Description of the Drawings and Description of Preferred Embodiments.

BRIEF DESCRIPTION OF THE DRAWINGS

FIGS. 2a, 2b, and 2c are illustrations of various modulation schemes.

DESCRIPTION OF PREFERRED EMBODIMENTS

Figure 1:
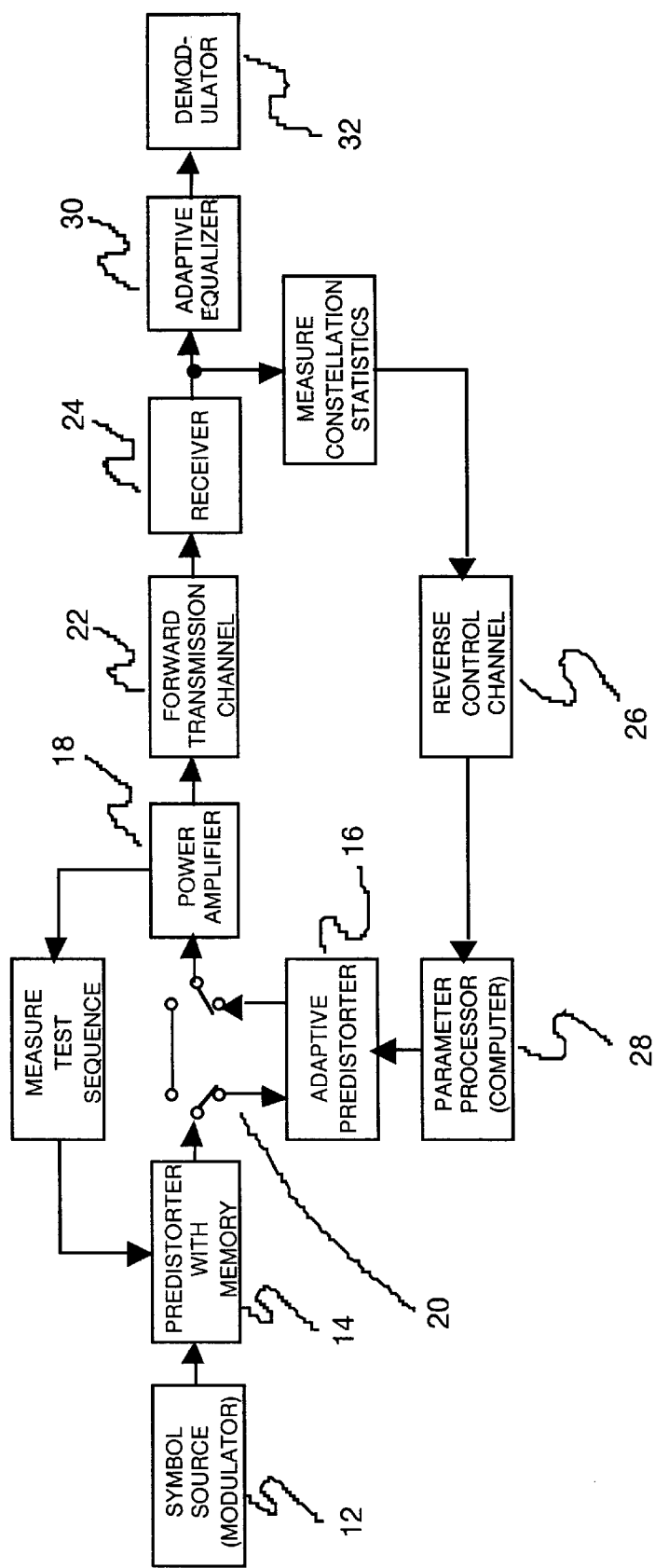
FIG. 1 is a block diagram of the predistortion system of the present invention.

Referring now to FIG. 1, therein is shown a block diagram of the predistortion system of the present invention. The symbol source, or modulator, 12 supplies the data to be transmitted. This data may be in QAM or any other of the above mentioned formats. The modulated symbol stream is first input to a predistorter with memory 14, which may be implemented in accordance with the teachings of Karam and Sari discussed above. The data output from the predistorter with memory 14 is then input to an adaptive predistorter 16. The output of the adaptive predistorter 16 is then input to a power amplifier 18. The predistorter with memory 14 is generally used if the power amplifier is operated in a nonlinear mode, in which case it functions to compensate for the nonlinear effects of the power amplifier 18. In the case of a nonlinear power amplifier 18, then from time to time a test sequence of symbols is sent directly to the power amplifier 18, bypassing the adaptive predistorter 16 by means of switch 20. The test sequence must be re-sent at a rate comparable with the rate at which the gain of the power amplifier changes due to temperature or voltage variations. The test sequence can either be sent as a continuous symbol stream that occasionally interrupts the data stream, or preferably as selected symbols that are part of the overhead bits that accompany each frame of data. The frequency at which the test sequence is utilized depends upon the particular operating environment. These test symbols are extracted from the power amplifier output, their normalized distance from the origin of the symbol constellation is measured, and the measurements are used to readjust the symbol position mapping in the memory of the predistorter. Alternatively, the adaptive predistorter 16 may be used to compensate for the nonlinear operation of the power amplifier 18.

From the power amplifier 18, the signal propagates through the forward transmission channel 22 to the receiver 24. At the receiver 24, the statistics regarding the positions, sizes, and shapes of the symbol clusters are measured on a periodic basis, and are sent via the reverse control channel 26 to the parameter processor computer 28 at the transmitter. The statistics are measured at the receiver 24 because transmitting the raw in-phase and quadrature (I-Q) measurements on all symbols used in the statistical analysis over the narrowband reverse control channel would greatly exceed the capacity of that channel. Generally, the distortion on the reverse control channel is significantly less than that on the forward channel and does not affect the transmission of the statistical information. The processor 28 calculates the parameters of the constellation distortions that arise in the forward channel and receiver. These parameters are used to adjust the I-Q coordinates of the transmitted symbols in the adaptive predistorter 16 so as to minimize the resulting received distortions. For some types of distortions, such as linear constellation offsets due to voltage biases in the receiver or gain imbalances (giving unequal scales in the I and Q coordinates) in the receiver, the values of the corrective voltages may be sent to the receiver 24 in the overhead bits on the forward transmission channel 22 to reduce the effects of these constellation offsets and gain imbalances. Finally, an adaptive equalizer 30 mitigates the effects of multipath propagation and frequency dependent (dispersive) phenomena, such as Rayleigh fading, over the forward transmission channel 22. The corrected symbol data then goes to the demodulator 32 where the information bit stream is extracted.

Referring now to FIGS. 2a, 2b and 2c, therein are illustrated the configurations of 16-QAM (quadrature amplitude modulation), 32-Cross QAM, and 25-QPR (quadrature partial response) symbol constellations. For the QAM and QPR constellations, the states are numbered in the x and y directions as i=1,2, . . ., and j=1,2, . . . , respectively, beginning in the lower left-hand corner. However, in an origin-centered coordinate system, the constellation point (i,j) will ideally be located at coordinates $(X_{ij}, Y_{ij}) = (\hat{i}, \hat{j})$, where $$\hat{i} = i - \frac{M+1}{2}, \quad \hat{j} = j - \frac{M+1}{2} \tag{1}$$

wherer M is the number of symbols in each coordinate. For example, for the 16-QAM constellation of FIG. 2a, M=4, and for i=1, . . . ,4 we have $\hat{i}$=−3/2, −1/2, 1/2, and 3/2. For ease of notation, the following expression will be used:

$$d = (M+1)/2. \tag{2}$$

Due to various system impairments, the actual centers of the observed measurement clusters will not fall exactly on the ideal state locations in the constellation plot. However, it is assumed that the locations of the cluster centers can be fit to a pair of coupled nonlinear polynomials in i and j, as follows:

$$\hat{x}_{ij} = A_x + B_{xx}(i-d) + B_{xy}(j-d) + C_{xx}(i-d)^2 + C_{xy}(j-d)^2 + D_{xx}(i-d)^3 + D_{xy}(j-d)^3, \tag{3a}$$

$$\hat{y}_{ij} = A_y + B_{yx}(i-d) + B_{yy}(j-d) + C_{yx}(i-d)^2 + C_{yy}(j-d)^2 + D_{yx}(i-d)^3 + D_{yy}(j-d)^3, \tag{3b}$$

Here, $\hat{x}_{ij}$ and $\hat{y}_{ij}$ are the estimated model coordinates for the center of cluster (i,j). $A_x$ and $A_y$ are constants which represent the constellation offsets in the x and y directions, respectively. $B_{xx}$ and $B_{yy}$ are the linear gains, or column and row spacings, respectively (i.e., the first order change in the x and y directions). $B_{xy}$ is the linear run per unit rise, or horizontal skew, in the column position as a function of row (i.e., the first order change in the x direction as a function of the y coordinate value at that point). $B_{yx}$ is the linear rise per unit run, or vertical skew, in the row position as a function of column (i.e., the first order change in the y direction as a function of the x coordinate value at that point). $C_{xx}$, $C_{yy}$, $D_{xx}$, and $D_{yy}$ are the corresponding nonlinear gains, or variations in the column and row spacings. Specifically, $C_{xx}$ is the second order change in the x direction; $C_{yy}$ is the second order change in the y direction; $D_{xx}$ is the third order change in the x direction; and $D_{yy}$ is the third order change in the y direction. Similarly, $C_{xy}$, $C_{yx}$, $D_{xy}$, and $D_{yx}$ are the corresponding nonlinear (second and third order) skews in the column and row positions. In the ideal undistorted case, $B_{xx} = B_{yy} = 1$, and all other model parameters are zero. To obtain $\hat{x}_{ij}$ and $\hat{y}_{ij}$ we must use the sets $\{x_{ijk}\}$ and $\{Y_{ijk}\}$ (where k denotes the individual symbols within each cluster) to estimate the parameters $A_x$, $B_{xx}$, . . . .

The problem of estimating the parameters of the equations that provide a best least-squares fit to the available data samples (measured constellation points in phase space) is one of multiple linear regression, since the estimates depend linearly on the parameters. The standard statistical procedure for estimating such parameters from an overdetermined set of data (i.e., there are more data samples than parameters) is to set up and solve the so-called "normal equations" for least squares estimation (see, e.g., N.R. Draper and H. Smith, *Applied Regression Analysis*, John Wiley & Sons, Inc., 1966 which is incorporated by reference herein).

Matrix notation will be used to set up and solve the corresponding normal equations for the parameters in Equations (3). The parameter matrices $P_x$ and $P_y$ and the matrix of coefficients $C_{ij}$ for cluster (i,j) are defined as follows:

$$P'_X = |A_x\ B_{xx}\ B_{xy}\ C_{xx}\ C_{xy}\ D_{xx}\ D_{xy}|, \quad (4a)$$

$$P'_Y = |A_y\ B_{yx}\ B_{yy}\ C_{yx}\ C_{yy}\ D_{yx}\ D_{yy}|, \quad (4b)$$

and $$C_{ij} = \begin{vmatrix} 1 & (i-d)_1 & (j-d)_1 & (i-d)_1^2 & (j-d)_1^2 & (i-d)_1^3 & (j-d)_1^3 \\ \vdots & \vdots & \vdots & \vdots & \vdots & \vdots & \vdots \\ 1 & (i-d)_{K_{ij}} & (j-d)_{K_{ij}} & (i-d)_{K_{ij}}^2 & (j-d)_{K_{ij}}^2 & (i-d)_{K_{ij}}^3 & (j-d)_{K_{ij}}^3 \end{vmatrix}. \quad (5)$$

The prime (') here denotes the matrix transpose. Also, the matrices, $D_{x_{ij}}$ and $D_{y_{ij}}$ the matrices of x and y coordinates of all symbols in the (i,j)-th cluster, and error matrices, $E_{x_{ij}}$ and $E_{y_{ij}}$, for cluster (i,j) are defined as $$D_{x_{ij}} = \begin{vmatrix} x_{ij1} \\ \vdots \\ x_{ijK_{ij}} \end{vmatrix}, \quad D_{y_{ij}} = \begin{vmatrix} y_{ij1} \\ \vdots \\ y_{ijK_{ij}} \end{vmatrix}, \quad (6)$$

and $$E_{x_{ij}} = \begin{vmatrix} x_{ij1} - \hat{x}_{ij} \\ \vdots \\ x_{ijK_{ij}} - \hat{x}_{ij} \end{vmatrix}, \quad E_{y_{ij}} = \begin{vmatrix} y_{ij1} - \hat{y}_{ij} \\ \vdots \\ y_{ijK_{ij}} - \hat{y}_{ij} \end{vmatrix}. \quad (7)$$

It should be noted that there are $K_{ij}$ data samples in cluster (i,j), and that there are $K_{ij}$ identical elements in each column of $C_{ij}$.

Since the parameters $A_x$, $B_{xy}$, ... are dependent upon the data samples in all clusters, the observations of all clusters are combined in estimating these parameters. The composite coefficient, data, and error matrices C, $D_x$, $D_y$, $E_x$, and $E_y$ for the entire constellation are defined as the following partitioned matrices $$C = \begin{vmatrix} C_{11} \\ \vdots \\ C_{MM} \end{vmatrix}, \quad (8)$$

$$D_x = \begin{vmatrix} D_{x_{11}} \\ \vdots \\ D_{x_{MM}} \end{vmatrix}, \quad D_y = \begin{vmatrix} D_{y_{11}} \\ \vdots \\ D_{y_{MM}} \end{vmatrix}, \quad (9)$$

and $$E_x = \begin{vmatrix} E_{x_{11}} \\ \vdots \\ E_{x_{MM}} \end{vmatrix}, \quad E_y = \begin{vmatrix} E_{y_{11}} \\ \vdots \\ E_{y_{MM}} \end{vmatrix}. \quad (10)$$

The model equations (3) may now be written in matrix form as $$D_x = CP_x + E_x, \quad (11a)$$

$$D_y = CP_y + E_y. \quad (11b)$$

The normal equations for estimating the parameter matrices $P_x$ and $P_y$ are given by $$C'CP_x = C'D_x, \quad (12a)$$

$$C'CP_y = C'D_y, \quad (12b)$$

where the prime (') indicates the matrix transpose. The solution of these equations yields $$P_x = (C'C)^{-1}C'D_x, \quad (13a)$$

$$P_y = (C'C)^{-1}C'D_y, \quad (13b)$$

where $^{-1}$ denotes the inverse of a matrix. The following relationships are also defined:

$$A = C'C, \quad (14)$$

$$B_x = C'D_x, \quad (15a)$$

$$B_y = C'D_y. \quad (15b)$$

Equations (13) then become $$P_x = A^{-1}B_x, \quad (16a)$$

$$P_y = A^{-1}B_y. \quad (16b)$$

The above analysis is similar to that of McKissock (M. J. McKissock, "Constellation Measurement: A Tool for Evaluating Digital Radio," *Hewlett-Packard Journal*, July 1987, the contents of which are incorporated herein by reference).

However, the present analysis is further extended to the estimation of the nonlinear terms in Equations (3a) and (3b).

Using Equations (8) and (5) in (14), and defining $l_i = i - d$ and $m_j = j - d$, the following result is obtained:

$$A = \quad (17)$$

$$\sum_{i=1}^{M}\sum_{j=1}^{M}\sum_{k=1}^{K_{ij}} \begin{vmatrix} 1 & l_{ik} & m_{jk} & l_{ik}^2 & m_{jk}^2 & l_{ik}^3 & m_{jk}^3 \\ l_{ik} & l_{ik}^2 & l_{ik}m_{jk} & l_{ik}^3 & l_{ik}m_{jk}^2 & l_{ik}^4 & l_{ik}m_{jk}^3 \\ m_{jk} & l_{ik}m_{jk} & m_{jk}^2 & l_{ik}^2m_{jk} & m_{jk}^3 & l_{ik}^3m_{jk} & m_{jk}^4 \\ l_{ik}^2 & l_{ik}^3 & l_{ik}^2m_{jk} & l_{ik}^4 & l_{ik}^2m_{jk}^2 & l_{ik}^5 & l_{ik}^2m_{jk}^3 \\ m_{jk}^2 & l_{ik}m_{jk}^2 & m_{jk}^3 & l_{ik}^2m_{jk}^2 & m_{jk}^4 & l_{ik}^3m_{jk}^2 & m_{jk}^5 \\ l_{ik}^3 & l_{ik}^4 & l_{ik}^3m_{jk} & l_{ik}^5 & l_{ik}^3m_{jk}^2 & l_{ik}^6 & l_{ik}^3m_{jk}^3 \\ m_{jk}^3 & l_{ik}m_{jk}^3 & m_{jk}^4 & l_{ik}^2m_{jk}^3 & m_{jk}^5 & l_{ik}^3m_{jk}^3 & m_{jk}^6 \end{vmatrix}.$$

It should be noted that since each term in (17) is summed over the same range in i, in j, and in k, A remains a 7×7 matrix.

Similarly, using Equations (6) and (8) in (15a) and (15b) results in $$B_x = \sum_{i=1}^{M} \sum_{j=1}^{M} \sum_{k=1}^{K_{ij}} \begin{vmatrix} x_{ijk} \\ l_{ik} x_{ijk} \\ m_{jk} x_{ijk} \\ l_{ik}^2 x_{ijk} \\ m_{jk}^2 x_{ijk} \\ l_{ik}^3 x_{ijk} \\ m_{jk}^3 x_{ijk} \end{vmatrix}$$ (18)

and $$B_y = \sum_{i=1}^{M} \sum_{j=1}^{M} \sum_{k=1}^{K_{ij}} \begin{vmatrix} y_{ijk} \\ l_{ik} y_{ijk} \\ m_{jk} y_{ijk} \\ l_{ik}^2 y_{ijk} \\ m_{jk}^2 y_{ijk} \\ l_{ik}^3 y_{ijk} \\ m_{jk}^3 y_{ijk} \end{vmatrix}.$$ (19)

Again, since each term in equations (18) and (19) is summed over the same range in i, in j, and in k, $B_x$ and $B_y$ remain 1×7 matrices.

In the invention, the parameter matrices $P_x$ and $P_y$ are obtained by inserting Equations (17), (18), and (19) into (16a) and (16b), and evaluating the results with the actual data coordinate values $x_{ijk}$ and $Y_{ijk}$. This gives the coefficients in Equations (3). The components of $P_x$ and $P_y$, as given by Equations (4), are then inserted into Equations (3) to evaluate the best-fit model coordinates, $(\hat{x}_{ij}, \hat{y}_{ij})$, of each cluster in the constellation.

The x and y offsets of the actual measured constellation from the center of the ideal constellation plot ($\tilde{x}=0, \tilde{y}=0$) are equal to $A_x$ and $A_y$, respectively. If there are no rotational or quadrature distortions (lock angle error, quad angle error, AM-PM conversion nonlinearity) of the constellation, then the x and y offsets in the I and Q directions are the only constellation offsets. If the estimated x and y offsets, $A_x$ and $A_y$, are not zero, commands are sent to the receiver 24 to adjust bias voltages to shift the constellation by amounts $-A_x$ and $-A_y$, i.e., to shift the constellation back to center. Alternatively, all transmitted symbols may be pre-shifted by amounts $-A_x$ and $-A_y$ at the transmitter to accomplish the same effect. In general, since translational offsets in the constellation ($A_x$ and $A_y$) are typically due to misadjustments in the reciever, it is better to correct for such receiver errors at their source, within the receiver 24. However, if it is essential to obtain a receiver 24 with minimum complexity and minimum cost, it may be better to forego adjustability in the receiver 24, and instead predistort the symbols coming out of the transmitter so as to compensate for the uncorrectable errors in the receiver 24.

The linear gain ratio between the x and y coordinates is $$R_G = B_{xx}/B_{yy}.$$ (20)

Again, in the absence of rotational and quadrature distortions, this gain ratio is equal to the net linear I-Q gain mismatch of the modulator (transmitter) and demodulator (receiver). In the presence of rotational or quadrature distortions, the I-Q gain mismatch is not so simply related to the x-y gain ratio. If the gain imbalance is assumed to be all in the receiver 24 (i.e., no distortions are assumed to be introduced by the transmitter and the forward transmission channel 22) and $R_G>1$, then a command may be sent to the receiver 24 to either decrease the in-phase gain by a factor of $R_G$, or increase the quadrature gain by the same factor. If $R_G<1$ then a command may be sent to the receiver 24 to either increase the in-phase gain by a factor of $R_G$, or decrease the quadrature gain by the same factor.

It should be noted that this gain ratio $R_G$ is defined to depend upon only the linear terms in Equations (3). $B_{xx}$ and $B_{yy}$ are the spacings between adjacent columns and rows, respectively, in the constellation, assuming that all columns and rows are uniformly spaced (negligible nonlinearities $C_{xx}$, $D_{xx}$, etc.). If the nonlinear terms are non-negligible, the column and row spacing will be a function of amplitude. In that case, the second and third order gain ratios may be defined as follows:

$$R_{G2} = C_{xx}/C_{yy},$$ (21)

and $$R_{G3} = D_{xx}/D_{yy}.$$ (22)

However, if the C and D terms are non-negligible, this indicates that there are additional nonlinearities in the forward transmission channel 22 and/or receiver 24 that were not corrected by the memory based predistorter 14. In that case, it may be better to readjust the coordinates of the transmitted symbols at the transmitter, using the adaptive predistorter 16. If $R_{G_2}>1$, then either $C_{xx}$ is decreased by a factor of $R_{G_2}$, or $C_{yy}$ is increased by the same factor. Similarly, if $R_{G_3}>1$, then either $D_{xx}$ is decreased by a factor of $R_{G_3}$, or $D_{yy}$ is increased by the same factor.

Lock angle error measures the angle of rotation of the constellation relative to its ideal position. This type of error arises from factors such as carrier-recovery phase-lock loop misadjustment (demodulator not correctly phased with the incoming signal) or interfering tones upsetting the carrier recovery loop.

Figure 3B:
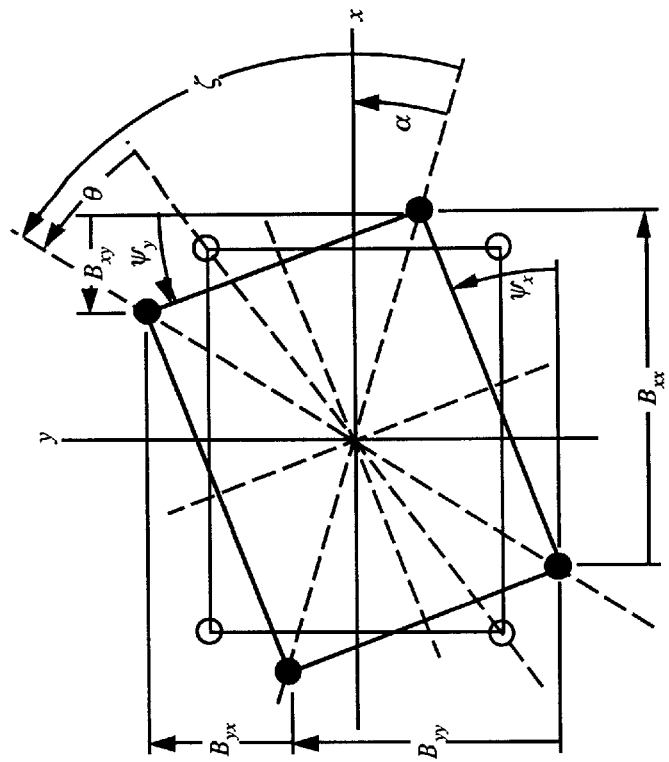
FIG. 3b is an illustration of the effects of negative lock angle error.
Figure 3A:
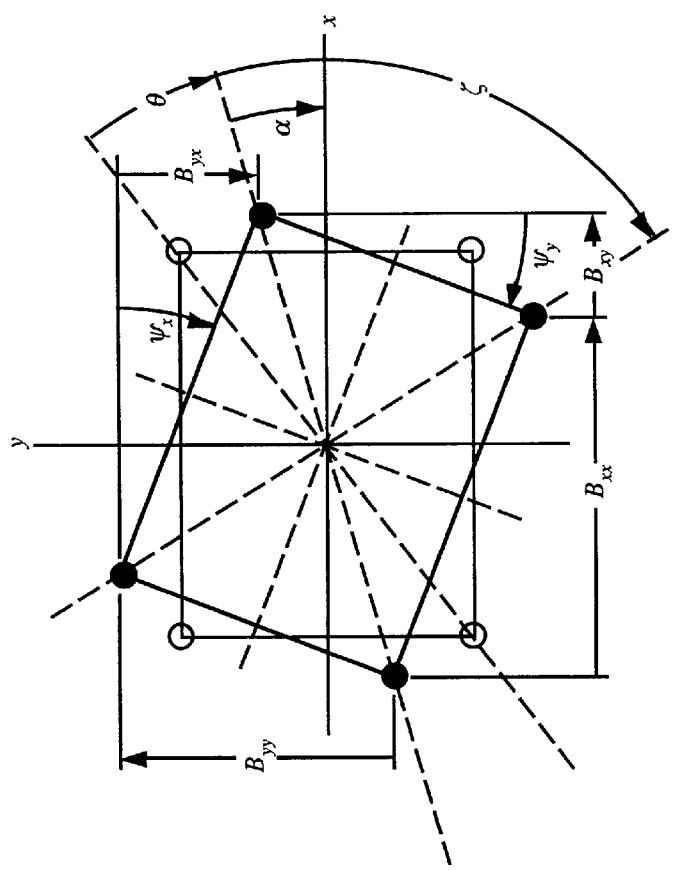
FIG. 3a is an illustration of the effects of positive lock angle error.

FIGS. 3a and 3b are illustrations of lock angle error in the presence of a gain mismatch for the simple case of QPSK (i.e., 4-QAM) modulation. The angle of phase rotation (the lock angle error) θ is here defined as positive in the clockwise direction. FIG. 3a shows the geometry for positive θ, and FIG. 3b shows the geometry for negative θ. $B_{xx}$ is the measured spacing between columns of constant I coordinate, as projected upon the x axis. $B_{yy}$ is the measured spacing between rows of constant Q coordinate, as projected upon the y axis. $B_{xx}$ is measured positive to the right, and $B_{yy}$ is measured positive upward. $B_{xy}$ is the linear run per unit rise measured between successive rows of clusters. $B_{yx}$ is the linear rise per unit run measured between successive columns of clusters. It should be noted that $B_{xy}$ is measured positive to the right in going from a lower to an upper row. Similarly, $B_{yx}$ is measured positive upward in going from a left to a right-hand column. These conventions are established to provide consistency in equations and results for all possible combinations of lock and quad angle errors.

Other angles shown in FIGS. 3a and 3b include α, the angle from the rightmost cluster in the rotated constellation to the positive x axis, and ζ, the angle between the diagonals of the rotated constellation, measured between the right hand clusters having a common I coordinate, and originating at the rightmost cluster. $\psi_x$ and $\psi_y$ are defined as $\psi_x = -\tan^{-1}(B_{yx}/B_{xx})$ and $\psi_y = \tan^{-1}(B_{xy}/B_{yy})$. The lock angle error is then given as $$\theta = \frac{1}{2}\left(\tan^{-1}\frac{B_{xy}}{B_{yy}} - \tan^{-1}\frac{B_{yx}}{B_{xx}}\right). \qquad (23)$$

It should be noted that by the sign definitions for the $B_{mn}$ defined above, for positive lock angle error $B_{yx}$ is negative and all other $B_{mn}$ are positive. Therefore, both terms in Equation (23) are positive, leading to $\theta>0$, as expected. Similarly, for negative lock angle error, $B_{xy}$ is negative and all other $B_{mn}$ are positive. Therefore, both terms in Equation (23) are negative, leading to $\theta<0$. In the absence of any lock angle error, $\theta=0$, so that Equation (23) leads to $$B_{xy}/B_{yy}=B_{yx}/B_{xx}. \qquad (24)$$

Even if $\theta=0$, $B_{xy}$ and $B_{yx}$ can be non-zero. This is the case when there is quad angle error (discussed in detail below) but no lock angle error. When there are neither lock angle nor quad angle errors, then $B_{xy}=B_{yx}\equiv 0$.

A useful alternative expression for the lock angle error can be obtained from the angles in FIGS. 3a and 3b. Noting that the constellation is symmetric about its axes (either with or without lock angle rotation), these figures shows that $$\theta=\zeta/2-\alpha. \qquad (25)$$

Recalling that angles are defined positive clockwise, FIG. 3a shows that for positive lock angle error, $\zeta>0$, $\alpha>0$, and $\theta>0$. Similarly, FIG. 3b shows that for negative lock angle error, $\zeta<0$, $\alpha<0$, and $\theta<0$. $\zeta$ and $\alpha$ can be obtained in terms of the $B_{mn}$, leading to an expression for $\theta$ in terms of the $B_{mn}$. Equation (23) is valid for the case of no quad angle error. It is also valid for the case of quad angle error with no lock angle error, in which case Equation (24) holds and $\theta=0$. However, when lock angle and quad angle errors are both present, Equation (23) may not give the correct result. Equation (25), which is more general, should then be used. An expression for (25) in terms of the $B_{mn}$ will be given below.

Quad angle error measures the degree of departure of the I and Q coordinates of the modulator and demodulator from orthogonality in the x-y plane, indicating that the two modulator or demodulator branches are not strictly in phase quadrature. As a result, the output of the threshold decision slicer in one coordinate at the demodulator will depend on the value of the other coordinate as well, leading to decision errors in determining which symbol was actually transmitted. Essentially, when quad angle error is present, the constellation is "stretched" along one diagonal direction and compressed along the other diagonal direction. In contrast, lock angle error results in a fixed rotation of the entire constellation, without "stretching".

Figure 4B:
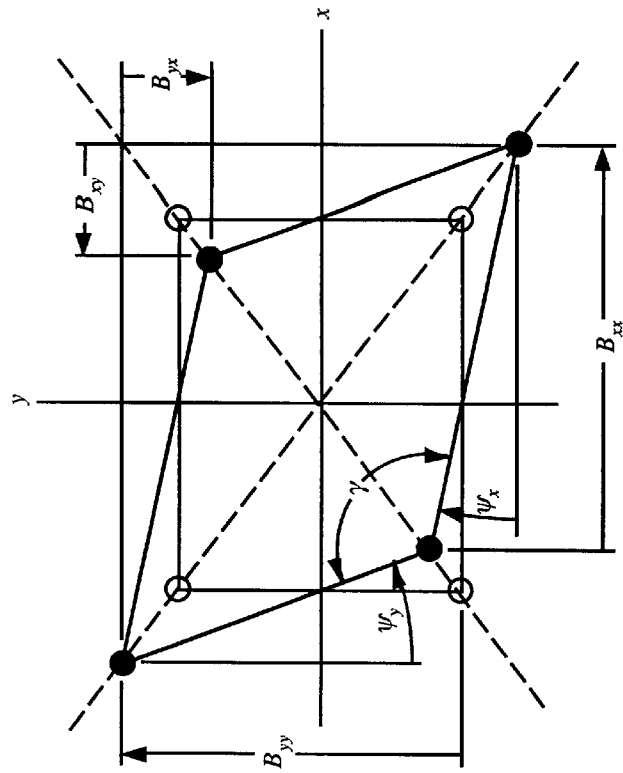
FIG. 4b is an illustration of the effects of negative quad angle error.
Figure 4A:
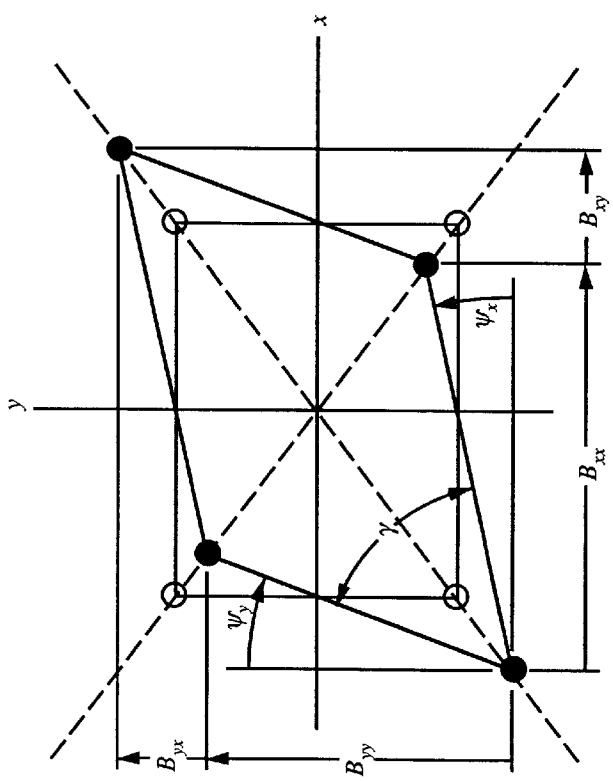
FIG. 4a is an illustration of the effects of positive quad angle error.

FIGS. 4a and 4b are illustrations of quad angle error in the presence of a gain mismatch, but no lock angle rotation, in the simple case of QPSK modulation. Again, all results in this section will apply equally well to all QAM and QPR modulations of any order. The coordinate gains $B_{xx}$ and $B_{yy}$ and the skews $B_{xy}$ and $B_{yx}$ are defined with the same sign conventions as noted previously for FIGS. 3a and 3b. Also, the angles $\psi_x$ and $\psi_y$, defined previously, have the same sign convention as before, with positive being in the clockwise.

In the absence of quad angle error, the constellation is rectangular (square if there is no gain imbalance between the I and Q components). The corner angles of a rectangle are, of course 90 degrees. If there is a quad angle error, the constellation is no longer rectangular, and the corner angles are either greater or less than 90 degrees. Let $\gamma$ denote the corner angle about the principle diagonal (the diagonal oriented upward to the right). The quad angle error $\Psi$ is the amount by which $\gamma$ departs from 90 degrees. Thus, $\gamma=90°+\Psi$. When $\Psi$ is negative, $\gamma<90°$, as in FIG. 4a; when $\Psi$ is positive, $\gamma>90°$, as in FIG. 4b.

The quad angle error $\Psi$ is related to the angles $\psi_x$ and $\psi_y$ by $$\Psi = \psi_x - \psi_y \qquad (26)$$
$$= -\tan^{-1}\frac{B_{yx}}{B_{xx}} - \tan^{-1}\frac{B_{xy}}{B_{yy}}.$$

For the case of negative quad angle error, as shown in FIG. 4a, $B_{xy}$ and $B_{yx}$ are both positive, so that $\psi_x$ is negative, $\psi_y$ is positive, and $\Psi$ is negative. The angles $\psi_x$ and $\psi_y$ are positive in the clockwise direction and negative in the counterclockwise direction. For the case of positive quad angle error, as shown in FIG. 4b, $B_{xy}$ and $B_{yx}$ are both negative, so that $\psi_x$ is positive, $\psi_y$ is negative, and $\Psi$ is positive. It should be noted that although quad angle error changes the lengths of the sides and diagonals of the constellation pattern, the angles between the diagonals remain unchanged.

In the absence of any quad angle error, $\Psi=0$, so that Equation (26) leads to $$B_{xy}/B_{yy}=-B_{yx}/xx. \qquad (27)$$

When there is no quad angle error and no lock angle error, Equations (24) and (27) must both be simultaneously satisfied. This can only be possible if $B_{xy}=B_{yx}=0$. FIGS. 3a, 3b, 4a and 4b show that these conditions lead to an unrotated, undistorted, rectangular constellation.

It is generally not known a priori what impairments are present in the receiver and demodulator, and what the mix and relative magnitudes are of the various constellation distortions such as lock angle error, quad angle error, and gain mismatch Therefore, for the general case, it must be assumed that all types of errors are present, and that the magnitudes of all types of errors must be solved for.

Figure 5:
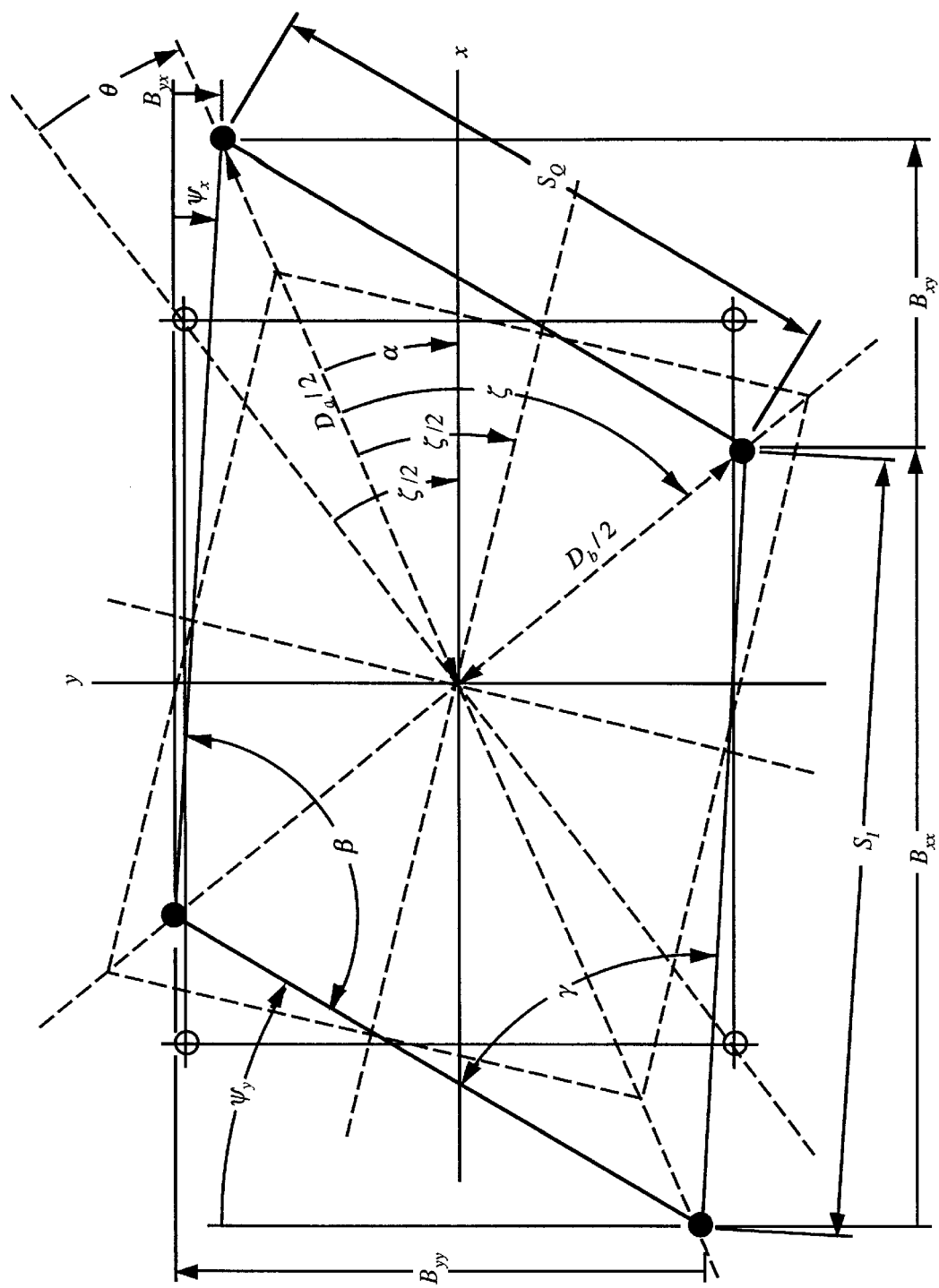
FIG. 5 is an illustration of the effects of combined lock angle error, quad angle error, and gain mismatch.

FIG. 5 is an illustration of combined lock angle error, quad angle error, and gain mismatch which shows the effect of a quad angle error superimposed upon a rotated rectangular QPSK constellation with lock and gain mismatch errors. The x and y gains and skews, $B_{mn}$, derived from the regression analysis of the observed data in the constellation model of Equations (3), indicate the spacings of the clusters in the distorted constellation. Again, the $B_{mn}$ are defined to be positive upward and to the right, so that in FIG. 5 all the $B_{mn}$ except $B_{yx}$ are positive. The angles $\alpha$, $\theta$, and $\zeta$, defined previously, are again taken to be positive clockwise. $S_I$ is the in-phase (I) coordinate cluster spacing, and $S_Q$ is the quadrature (Q) coordinate cluster spacing of the distorted constellation. $D_a$ and $D_b$ are the lengths of the diagonals, and $\gamma$ y and $\beta$ are the internal angles, of the distorted constellation. Although the analysis of FIG. 5 is for a QPSK signal, the results are again applicable to all QAM and QPR constellations of all orders.

Analysis of FIG. 5 leads to the following general expressions for the lock angle error $\theta$ and the linear gain ratio $R_G$:

$$\theta = \frac{1}{2}\cos^{-1}\left[\frac{D_a^2 + D_b^2 - 4S_Q^2}{2D_aD_b}\right] - \tan^{-1}\left(\frac{B_{yy} + B_{yx}}{B_{xx} + B_{xy}}\right), \quad (28)$$

$$R_G = \sqrt{\frac{4S_Q^2 - (D_a - D_b)^2}{(D_a + D_b)^2 - 4S_Q^2}}, \quad (29)$$

where $$S_Q = \sqrt{B_{yy}^2 + B_{xy}^2}, \quad (30)$$

$$D_a = \sqrt{(B_{xx} + B_{xy})^2 + (B_{yy} + B_{yx})^2}, \quad (31)$$

$$D_b = \sqrt{(B_{xx} - B_{xy})^2 + (B_{yy} - B_{yx})^2}. \quad (32)$$

In the general situation, after the coefficients in Equation (3) are calculated, the lock angle error is obtained from Equation (28), the gain ratio is obtained from Equation (29), and the quad angle error is obtained from Equation (26). Since a non-zero lock angle error generally indicates a phase misadjustment in the carrier-recovery circuit of the receiver demodulator 32, so that the demodulated symbol phases are rotated by θ relative to the transmitted phases, this misadjustment can be corrected by sending a command to an adjustable phase shifter (located within the receiver 24) at the output of the carrier recovery circuit (located within the receiver 24) to shift the carrier phase by −θ, thereby rotating the entire constellation by −θ. Alternatively, the same effect could be achieved by shifting the phase of the carrier oscillator in the transmitter modulator by −θ. This would rotate the constellation into alignment with the symbol decision slicing circuitry in the demodulator equally well as by doing it in the carrier recovery circuit.

A non-zero quad angle error indicates a phase error in the quadrature phase shifter in either the modulator or demodulator, so that the two branches of either the modulator or demodulator are not in phase quadrature, i.e., 90° apart in phase. A quad angle error of Ψ in the modulator can be corrected by changing the modulator quadrature phase shifter by −Ψ. A quad angle error of Ψ in the demodulator can be corrected by either sending a command to the demodulator to change the demodulator quadrature phase shifter by an angle of −Ψ, or by predistorting the transmitted constellation by changing the modulator quadrature phase shifter by −Ψ. If quad angle errors are present in both the modulator and demodulator with a combined error of Ψ, then they can be simultaneously corrected by changing the modulator quadrature phase shifter by −Ψ. In general, it cannot be determined which device is responsible for the quad angle error without conducting separate special tests on each piece of equipment. Consequently, it is recommended that all quad angle errors be corrected by rotation of the modulator quadrature phase shifter by −Ψ.

As discussed above, gain imbalances may occur in the modulator 12 prior to combining the in-phase and quadrature channels, or in the demodulator 32 after separating these channels. Gain imbalance in the modulator 12 can be eliminated by providing an adjustable linear amplifier in one of the channels, e.g., the quadrature channel, prior to combining, and by varying this gain in the direction to bring the linear gain ratio $R_G$ to 1. Gain imbalance in the demodulator 32 can be corrected by either adjusting the gain of a linear amplifier in one arm of the demodulator 32 to bring $R_G$=1, or by predistorting the constellation by adjusting a linear amplifier in the modulator 12 to bring $R_G$=1. Since gain imbalances can occur in either or both the modulator 12 and demodulator 32, and since the source of the imbalance cannot be determined without conducting special tests on each device, it is recommended that all gain imbalances be corrected at the modulator 12.

Since the lock and quad angle errors and the gain imbalance are all due to different phenomena, and since all are calculated simultaneously from the constellation measurements, the corrections for all effects can be implemented directly and simultaneously. All measurements, calculations, and corrective adjustments should be repeated iteratively until the angle errors and gain imbalance are made acceptably small.

Figure 6:
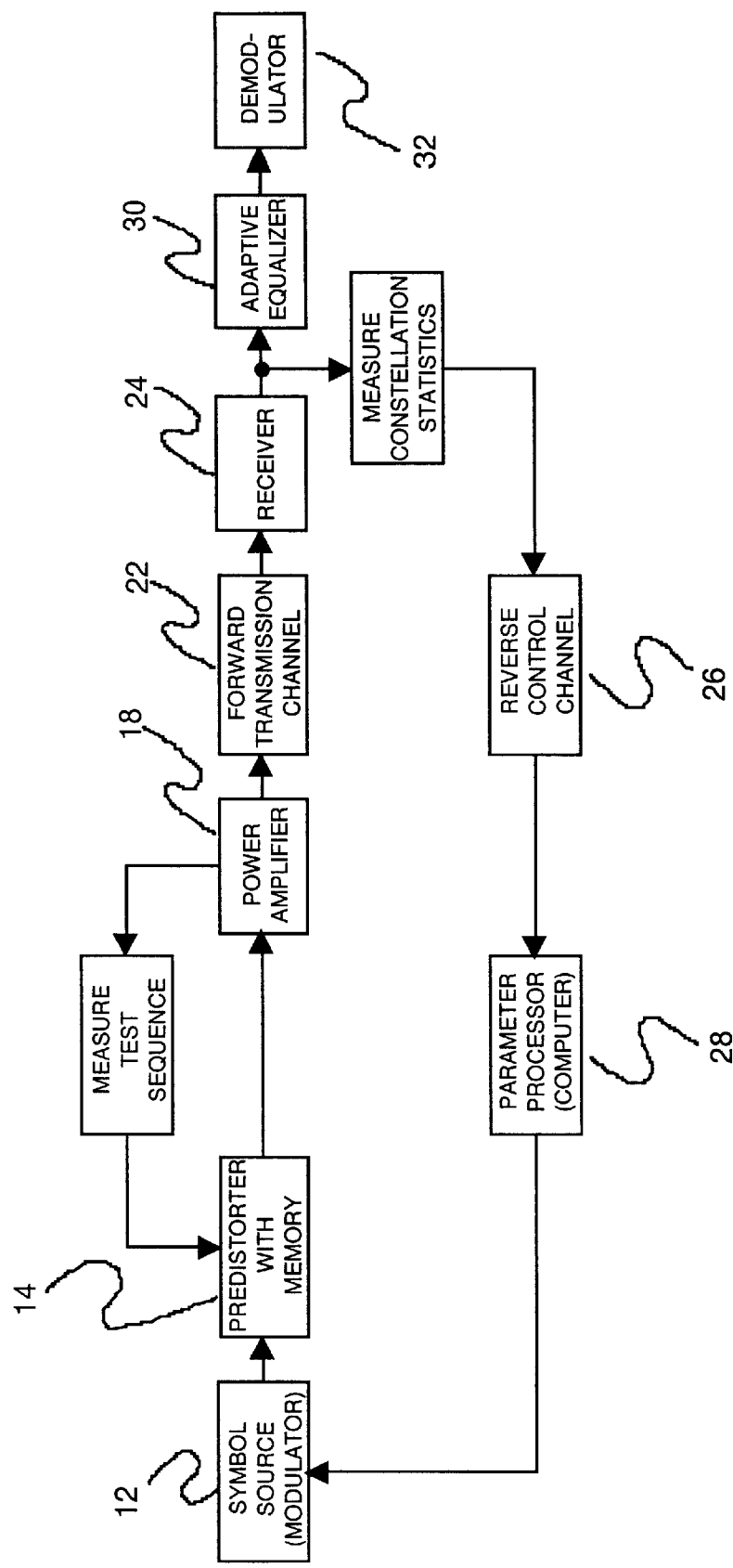
FIG. 6 is a block diagram of an alternative embodiment of the predistortion system of the present invention, which globally predistorts the signal by adjustment of a small number of transmitter parameters, rather than individually modifying the location in the constellation of each transmitted symbol.

Since all the linear effects addressed by the constellation analysis are corrected in the transmitter modulator 12, and since the transmitter high power amplifier 18 is likely to be the only source of nonlinearities (unless the forward transmission channel 22 includes several repeater stages or a satellite transponder, which insert additional nonlinear HPAs into the forward transmission channel 32), the control output of the parameter processor 28 in FIG. 1 can instead be routed to the modulator 12. In this configuration, compensation for the various errors described above is carried out in the modulator 12 instead of the separate adaptive predistorter 16, which is no longer necessary. This is shown in FIG. 6.

Figure 7:
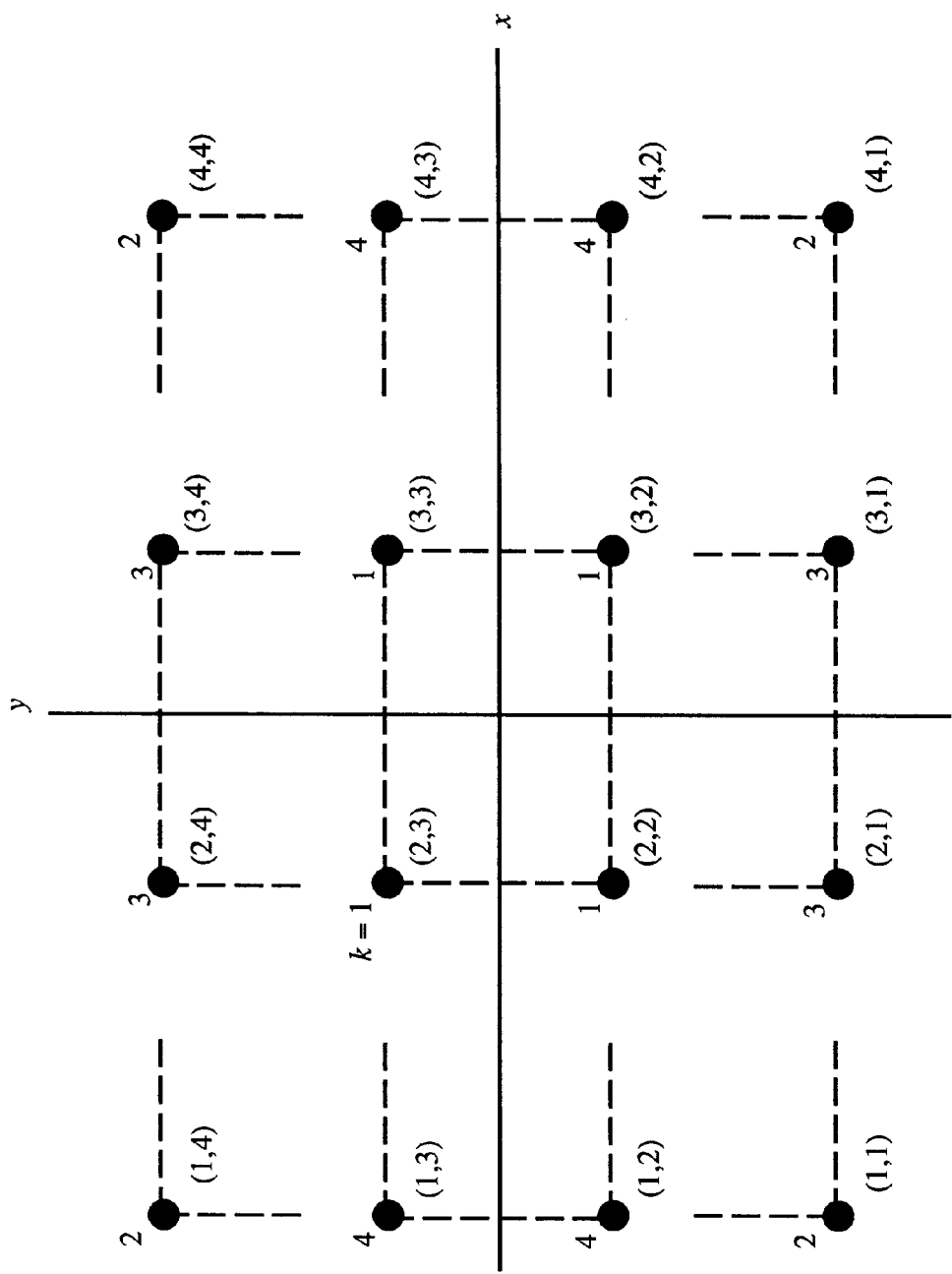
FIG. 7 is an illustration of the technique of constellation decomposition into a set of simple 4-QAM subconstellations, each of which can be individually predistorted in a quasi-linear manner.

The procedures described herein can be extended to compensate for nonlinear distortions in the total transmission path, including intermediate repeaters and transponders, by use of a method called constellation decomposition. When amplitude-dependent nonlinearities are present, any symmetric constellation may be treated as a set of nested QPSK subconstellations, as shown in FIG. 7 for a 16-QAM constellation with I-Q gain mismatch. The numbers in parentheses in FIG. 7 denote the (i,j) coordinates of the symbol clusters. The single numbers denote the subconstellations.

For a QPSK constellation, all symbol clusters have the same nominal distance from the I axis and from the Q axis. Therefore, since there are only four clusters in a QPSK constellation and their coordinates are linearly related (i.e., first order relationship), it is not possible to measure amplitude nonlinearities. Each elemental QPSK subconstellation (numbered k in FIG. 7) may thus be represented by a linear model:

$$\hat{x}'_{ij'k} = A_{x_k} + E_{xx_k}(i'-d') + E_{xy_k}(j'd'), \quad (33a)$$

$$\hat{y}'_{ij'k} = A_{x_k} + E_{yx_k}(i'-d') + E_{yy_k}(j'd'). \quad (33b)$$

Equations 33a and 33b correspond to Equation 3, but with only the constant and first order terms. For a QPSK constellation, d'=³⁄₂, i' and j' take on values in the set {1,2}, and (i'−d') and (j'−d') take on values in the set {−½,½}. The coordinates $(\hat{x}'_{i'j'k}, \hat{y}'_{i'j'k})$ in the subconstellation of course correspond to a set of coordinates $(\hat{x}_{ij}, \hat{y}_{ij})$ in the full constellation. For example, for Subconstellation 1, the following associations are made (It should be recalled that numbering begins in the lower left corner of the constellation or subconstellation, the first subscript is the x coordinate or row number, and the second subscript is the y coordinate or column number):

$$\hat{x}'_{111} = \hat{x}_{22}, \quad (34a)$$

$$\hat{x}'_{211} = \hat{x}_{23}, \quad (34b)$$

$$\hat{x}'_{121} = \hat{x}_{23}, \quad (34c)$$

$$\hat{x}'_{221} = \hat{x}_{33}, \quad (34d)$$

and similarly for the $\hat{Y}'_{i'j'k}$.

It should be further noted that FIG. 5 applies as well to the subconstellations, with the coefficients $B_{mn}$ replaced by the $E_{mn_k}$. Therefore, it is seen from FIG. 5 that $$E_{xx_k} = \hat{x}'_{21k} - \hat{x}'_{11k} = \hat{x}'_{22k} - \hat{x}'_{12k}, \quad (35a)$$

$$E_{xy_k} = \hat{x}'_{22k} - \hat{x}'_{21k} = \hat{x}'_{12k} - \hat{x}'_{11k}, \quad (35b)$$

$$E_{yx_k} = \hat{y}'_{21k} - \hat{y}'_{22k} = \hat{y}'_{22k} - \hat{y}'_{12k}, \quad (35c)$$

$$E_{yy_k} = \hat{y}'_{12k} - \hat{y}'_{11k} = \hat{y}'_{22k} - \hat{y}'_{21k}, \quad (35d)$$

By combining Equations (3), (34) and (35), expressions for the quantities $E_{mn_k}$ may be obtained for each subconstellation using Equations 3. These $E_{mn_k}$ expressions are expressed using the coefficient parameters of Equations 3 to relate the $E_{mn_k}$ coefficients to the coefficient parameters in Equations 3. For example, for subconstellation 1 in FIG. 7, the following relationship between the coefficient parameters is obtained:

$$E_{xx_1} = B_{xx} + 1/4 D_{xx}. \quad (36)$$

The general characteristics of the resulting quantities $E_{mn_k}$ are as follows:

1. The $E_{mn_k}$ are always independent of the constellation biases $A_X$ and $A_Y$.
2. The $E_{mn_k}$ are independent of the second-order coefficients $C_{mn}$.
3. The $E_{mn_k}$ depend on the $B_{mn}$ and $D_{mn}$ with the same subscripts m and n.
4. The x and y components that are based on differences between the same pair of symbol clusters (e.g., $E_{xx_3} = \hat{x}_{43} - \hat{x}_{24}$ and $E_{yx_3} = \hat{y}_{43} - \hat{y}_{24}$) have the same form.

Then, by analogy to Equations (30) to (32), the following quantities are defined:

$$S_{Q_k} = \sqrt{E_{yy_k}^2 + E_{xy_k}^2}, \quad (37)$$

$$D_{a_k} = \sqrt{(E_{xx_k} + E_{xy_k})^2 + (E_{yy_k} + E_{yx_k})^2}, \quad (38)$$

$$D_{b_k} = \sqrt{(E_{xx_k} - E_{xy_k})^2 + (E_{yy_k} - E_{yx_k})^2}. \quad (39)$$

These quantities are used in an extension of Equation (28) to obtain the lock angle error $\theta_k$ for Subconstellation k as $$\theta_k = \frac{1}{2} \cos^{-1}\left[\frac{D_{a_k}^2 + D_{b_k}^2 - 4S_{Q_k}^2}{2 D_{a_k} D_{b_k}}\right] - \tan^{-1}\left(\frac{E_{yy_k} + E_{yx_k}}{E_{xx_k} + E_{xy_k}}\right). \quad (40)$$

Also, by analogy with Equation (26), the quad angle error for Subconstellation k is given by $$\Psi_k = -\tan^{-1}\frac{E_{yx_k}}{E_{xx_k}} - \tan^{-1}\frac{E_{xy_k}}{E_{yy_k}}, \quad (41)$$

and by analogy with Equation (29), the gain ratio for Subconstellation k is given by $$R_{G_k} = \tan\frac{\zeta_k}{2} = \sqrt{\frac{4 S_{Q_k}^2 - (D_{a_k} - D_{b_k})^2}{(D_{a_k} + D_{b_k})^2 - 4 S_{Q_k}^2}}. \quad (42)$$

Equations (40), (41) and (42) give, respectively, the lock angle error, quad angle error, and gain imbalance for each subconstellation for the entire transmission chain, including the transmitter, receiver, and all intermediate repeaters and transponders.

It should be noted that in this formulation the ideal gain ratio for a subconstellation depends on its relation to the total constellation. Thus, in FIG. 7, the ideal gain ratios for Subconstellations 1 and 2, which are both square, are both equal to 1, while, the ideal gain ratios for Subconstellations 3 and 4, which are both rectangular, are 3 and ⅓, respectively. Since the ideal gain ratio of a symbol depends on its position in the constellation, the gain ratio cannot be corrected by adjusting an amplifier gain in the source transmitter modulator since this would apply the same gain to all transmitted symbols. Instead, the I and Q coordinates of each symbol must be scaled according to the desired gain ratio for the subconstellation, in the adaptive predistorter, to bring the gain ratio of the symbol (which is equivalent to the tangent of the vector from the origin to the symbol location) to its ideal value, $R_{G_k}$, where k denotes the particular subconstellation to which the symbol belongs. At the same time, the position of the symbol must be rotated about the origin by an angle of $-\theta_k$ to correct for the subconstellation lock angle error and associated nonlinear AM-PM conversion distortion. Similarly, the Q axis of the subconstellation to which the symbol belongs must be skewed by an angle of $-\Psi_k$ to compensate for the subconstellation's quad angle error. Similarly, compensation for lock angle error and quad angle error may be implemented on a subconstellation basis since the individual subconstellations may experience different lock angle and quad angle errors. This compensation is implemented by the adaptive predistorter of FIG. 1.

While the invention has been particularly shown and described with reference to a preferred embodiment thereof, it will be understood by those skilled in the art that various changes in form and details may be made therein without departing from the spirit and scope of the invention.

What is claimed is:

1. A method for adaptively compensating a digital signal, comprising the following steps:

accumulating statistical information at a receiver regarding a received signal transmitted by a transmitter, said accumulating step comprising the further steps of accumulating symbol cluster statistical information, accumulating weighted sums of the symbol coordinates to produce first, second and third matrices, inverting said first matrix and multiplying said inverted first matrix by said second matrix to produce a first coefficient matrix of the coefficients for a first coordinate of the constellation used in a least squares model for estimating the center of each symbol cluster, and multiplying said inverted first matrix by said third matrix to produce a second coefficient matrix of the coefficients for a second coordinate of the constellation used in said least squares model for estimating the center of each symbol cluster;

determining constellation distortions due to at least one voltage offset, gain mismatch ratio, lock angle error, quad angle error, nonlinear channel distortions and receiver distortions;

compensating for said constellation distortions in at least one of the in-phase and quadrature signal components of said signal;

processing said statistical information to determine compensation values; and using said compensation values to compensate said signal.

2. The method of claim 1, wherein said digital signal includes at least one of QAM (quadrature amplitude modulation), TCM (trellis coded modulation), CAP (carrierless AM/PM), MPSK (multiple phase shift keying), QPR (quadrature partial response) and signal constellations.

3. The method of claim 1, wherein said step of accumulating constellation statistical information and said processing step are used to determine predistortion parameters, said method comprising the further step of using said predistortion parameters to predistort said signal prior to transmission of said signal, whereby said received signal symbol clusters are properly located in accordance with predetermined signal decision boundaries.

4. The method of claim 1, further comprising the following steps:
transmitting from said receiver to a transmitter which transmitted said digital signals received at said receiver, statistical and control information indicative of the distortions in the received signals; and
processing said statistical and control information to determine at least one of type, magnitude and direction of compensating predistortions which may be applied at the transmitter to predistort said signal prior to its transmission, whereby the received signal at the receiver will have substantially no distortions.

5. The method of claim 1, wherein said compensating step is performed at one of the transmitter and receiver.

6. The method of claim 1, further comprising the following steps:
using a memory-based predistorter to compensate said signal;
determining any residual nonlinear distortion still present in said signal; and if so,
adaptively predistorting said signal to substantially eliminate said residual nonlinear distortion.

7. The method of claim 1, wherein control information indicative of said constellation distortions is exchanged between said transmitter and said receiver over a narrow bandwidth control channel.

8. The method of claim 7, wherein parameters in at least one of said receiver and transmitter are adjusted to correct distortions in said constellation arising from previously set parameter values.

9. The method of claim 1, wherein the step of determining constellation distortions due to lock angle error comprises the following steps:
determining at least one of the magnitude and direction of the lock angle error in the constellation; and
shifting the carrier phase in at least one of the transmitter and receiver to rotate the constellation in a direction and an amount which reduces the lock angle error.

10. The method of claim 1, wherein the step of determining constellation distortions due to quad angle error comprises the following steps:
determining at least one of the magnitude and direction of the quad angle error; and
adjusting at least one of the modulator quadrature phase shifter in the transmitter and the demodulator quadrature phase shifter in the receiver in a direction and an amount to reduce the quad angle error.

11. The method of claim 1, wherein the step of determining constellation distortions due to voltage offset comprises the following steps:
determining the magnitude of the voltage offset; and
adjusting the bias voltage in at least one of the transmitter and receiver in a direction and an amount to reduce the voltage offset.

12. The method of claim 1, wherein the step of determining constellation distortions due to gain mismatch ratio comprises the following steps:
determining the magnitude of the gain mismatch ratio; and
adjusting the amplifier gains in at least one of the transmitter and receiver in a direction and an amount to reduce the gain mismatch ratio.

13. The method of claim 1, wherein the step of determining constellation distortions due to nonlinear channel distortion comprises the following steps:
determining the magnitude of the nonlinear channel distortion; and
adjusting the position of each symbol within the constellation in at least one of the transmitter and receiver in a direction and an amount to reduce the nonlinear channel distortion.

14. The method of claim 1, wherein said first and second coordinates are the x and y cartesian coordinate dimensions of said symbol clusters, respectively.

15. The method of claim 1, wherein the step of accumulating weighted sums is performed in accordance with the following relationships to produce said first, second and third matrices, designated A, $B_x$ and $B_y$:

$$A = \sum_{i=1}^{M} \sum_{j=1}^{M} \sum_{k=1}^{K_{ij}} \begin{vmatrix} 1 & l_{ik} & m_{jk} & l_{ik}^2 & m_{jk}^2 & l_{ik}^3 & m_{jk}^3 \\ l_{ik} & l_{ik}^2 & l_{ik}m_{jk} & l_{ik}^3 & l_{ik}m_{jk}^2 & l_{ik}^4 & l_{ik}m_{jk}^3 \\ m_{jk} & l_{ik}m_{jk} & m_{jk}^2 & l_{ik}^2m_{jk} & m_{jk}^3 & l_{ik}^3m_{jk} & m_{jk}^4 \\ l_{ik}^2 & l_{ik}^3 & l_{ik}^2m_{jk} & l_{ik}^4 & l_{ik}^2m_{jk}^2 & l_{ik}^5 & l_{ik}^2m_{jk}^3 \\ m_{jk}^2 & l_{ik}m_{jk}^2 & m_{jk}^3 & l_{ik}^2m_{jk}^2 & m_{jk}^4 & l_{ik}^3m_{jk}^2 & m_{jk}^5 \\ l_{ik}^3 & l_{ik}^4 & l_{ik}^3m_{jk} & l_{ik}^5 & l_{ik}^3m_{jk}^2 & l_{ik}^6 & l_{ik}^3m_{jk}^3 \\ m_{jk}^3 & l_{ik}m_{jk}^3 & m_{jk}^4 & l_{ik}^2m_{jk}^3 & m_{jk}^5 & l_{ik}^3m_{jk}^3 & m_{jk}^6 \end{vmatrix},$$

$$B_x = \sum_{i=1}^{M} \sum_{j=1}^{M} \sum_{k=1}^{K_{ij}} \begin{vmatrix} x_{ijk} \\ l_{ik}x_{ijk} \\ m_{jk}x_{ijk} \\ l_{ik}^2 x_{ijk} \\ m_{jk}^2 x_{ijk} \\ l_{ik}^3 x_{ijk} \\ m_{jk}^3 x_{ijk} \end{vmatrix},$$

$$B_y = \sum_{i=1}^{M} \sum_{j=1}^{M} \sum_{k=1}^{K_{ij}} \begin{vmatrix} y_{ijk} \\ l_{ik}y_{ijk} \\ m_{jk}y_{ijk} \\ l_{ik}^2 y_{ijk} \\ m_{jk}^2 y_{ijk} \\ l_{ik}^3 y_{ijk} \\ m_{jk}^3 y_{ijk} \end{vmatrix}.$$

wherein l is defined as $(i-(M+1)/2)$ and m is defined as $(j-(M+1)/2)$, M is the number of symbols in each coordinate of the constellation and i and j are integers ranging from 1 to M which indicate the location of each cluster.

16. The method of claim 15, wherein said first and second coordinate coefficient matrices are of the form:

$$P_X^T = |A_x B_{xx} B_{xy} C_{xx} C_{xy} D_{xx} D_{xy}|,$$

$$P_Y^T = |A_y B_{yx} B_{yy} C_{yx} C_{yy} D_{yx} D_{yy}|,$$

wherein $A_x$ and $A_y$ are constellation offsets in the x and y directions, respectively, $B_{xx}$ and $B_{yy}$ are the linear gains in the x and y directions, respectively, $B_{xy}$ is the linear run per unit rise, $B_{yx}$ is the linear rise per unit run, $C_{xx}$, $C_{yy}$, $D_{xx}$ and $D_{yy}$ are the nonlinear gains in the x and y directions, respectively, $C_{xy}$, $C_{yx}$, $D_{xy}$ and $D_{yx}$ are the nonlinear skews in the x and y directions respectively, and wherein said coefficients A, B, C and D are used in a higher order least squares model of the estimated cluster center locations of the following form:

$$\hat{x}_{ij} = A_x + B_{xx}(i-d) + B_{xy}(j-d) + C_{xx}(i-d)^2 + C_{xy}(j-d)^2 + D_{xx}(i-d)^3 + D_{xy}(j-d)^3,$$

$$\hat{y}_{ij} = A_y + B_{yx}(i-d) + B_{yy}(j-d) + C_{yx}(i-d)^2 + C_{yy}(j-d)^2 + D_{yx}(i-d)^3 + D_{yy}(j-d)^3.$$

17. The method of claim 16, wherein said gain mismatch ratio $R_G$ is defined as the following ratio $B_{xx}/B_{yy}$.

18. The method of claim 16, wherein said second and third order gain mismatch ratios $R_{G2}$ and $R_{G3}$ are defined as the following ratios, respectively, $C_{xx}/C_{yy}$ and $D_{xx}/D_{yy}$.

19. The method of claim 16, wherein said lock angle error is determined in accordance with the following relationship:

$$\theta = \frac{1}{2}\left(\tan^{-1}\frac{B_{xy}}{B_{yy}} - \tan^{-1}\frac{B_{yx}}{B_{xx}}\right).$$

20. The method of claim 16, wherein said quad angle error is determined in accordance with the following relationship:

$$\Psi = \psi_x - \psi_y$$

$$= -\tan^{-1}\frac{B_{yx}}{B_{xx}} - \tan^{-1}\frac{B_{xy}}{B_{yy}}.$$

21. The method of claim 16, wherein the coefficient parameters are used to define the following quantities:

$$S_Q = \sqrt{B_{yy}^2 + B_{xy}^2},$$

$$D_a = \sqrt{B_{xx} + B_{xy}^2 + B_{yy} + B_{yx}^2},$$

$$D_b = \sqrt{B_{xx} - B_{xy}^2 + B_{yy} - B_{yx}^2}.$$

22. The method of claim 21, wherein lock angle error is determined in accordance with the following relationship:

$$\theta = \frac{1}{2}\cos^{-1}\left[\frac{D_a^2 + D_b^2 - 4S_Q^2}{2D_a D_b}\right] - \tan^{-1}\left(\frac{B_{yy} + B_{yx}}{B_{xx} + B_{xy}}\right).$$

23. The method of claim 21, wherein the gain mismatch ratio is determined in accordance with the following relationship:

$$R_G = \sqrt{\frac{4S_Q^2 - (D_a - D_b)^2}{(D_a + D_b)^2 - 4S_Q^2}}.$$

24. The method of claims 1 or 16, wherein said method is performed in a repeater circuit.

25. The method of claim 1, wherein said processing step is performed at one of said transmitter and receiver.

26. The method of claim 1, wherein compensating step is performed at one of said transmitter and receiver.

27. A method for adaptively compensating a digital signal which is being transmitted by a transmitter and received by a receiver, comprising the following steps:

modulating a digital signal at the transmitter according to a predetermined modulation scheme;

adaptively compensating said modulated signal at said transmitter in accordance with compensation values determined from statistical information accumulated at the receiver regarding the received signal;

transmitting said compensated modulated signal to said receiver;

receiving said compensated modulated signal at said receiver;

accumulating statistical information at said receiver regarding said received signal, said accumulating step comprising the further steps of accumulating symbol cluster statistical information and using said symbol cluster statistical information to accumulate constellation statistical information, accumulating weighted sums of the symbol coordinates to produce first, second and third matrices;

inverting said first matrix and multiplying said inverted first matrix by said second matrix to produce a first coefficient matrix of the coefficients for a first coordinate of the constellation used in a least squares model for estimating the center of each symbol cluster;

multiplying said inverted first matrix by said third matrix to produce a second coefficient matrix of the coefficients for a second coordinate of the constellation used in said least squares model for estimating the center of each symbol cluster;

processing said statistical information to determine compensation values for constellation distortions due to at least one of voltage offset, gain mismatch ratio, lock angle error, quad angle error, nonlinear channel distortions and receiver distortions;

wherein said adaptive compensation step compensates for said constellation distortions in at least one of the in-phase and quadrature signal components of said signal.

28. The method of claim 27, wherein said receiver transmits said statistical information over a reverse control channel to said transmitter and said processing step is performed at said transmitter.

29. The method of claim 27, wherein said processing step is performed at said receiver and said receiver transmits said compensation values to said transmitter over a reverse control channel.

30. The method of claim 27, further comprising the step of compensating said modulated signals using a memory-based predistorter.

31. The method of claim 27, wherein said digital signal is part of a signal constellation, and said method further comprises the steps of partitioning said signal constellation into a plurality of sub-constellations and performing said accumulating and processing steps for the signals within each sub-constellation.

32. A method for adaptively compensating a digital signal which is being transmitted by a transmitter and received by a receiver, comprising the following steps:

modulating a digital signal at the transmitter according to a predetermined modulation scheme;

adaptively compensating said modulated signal at said receiver in accordance with compensation values determined from statistical information accumulated at the receiver regarding the received signal;

transmitting said modulated signal to said receiver;

receiving said modulated signal at said receiver;

accumulating statistical information at said receiver regarding said received signal, said accumulating step comprising the further steps of accumulating symbol cluster statistical information and using said symbol cluster statistical information to accumulate constellation statistical information, accumulating weighted sums of the symbol coordinates to produce first, second and third matrices;

inverting said first matrix and multiplying said inverted first matrix by said second matrix to produce a first coefficient matrix of the coefficients for a first coordinate of the constellation used in a least squares model for estimating the center of each symbol cluster;

multiplying said inverted first matrix by said third matrix to produce a second coefficient matrix of the coefficients for a second coordinate of the constellation used in said least squares model for estimating the center of each symbol cluster;

processing said statistical information to determine compensation values for constellation distortions due to at least one of voltage offset, gain mismatch ratio, lock angle error, quad angle error, nonlinear channel distortions and receiver distortions;

wherein said adaptive compensation step compensates for said constellation distortions in at least one of the in-phase and quadrature signal components of said signal.

33. The method of claim 32, wherein said receiver transmits said statistical information over a reverse control channel to said transmitter, said processing step is performed at said transmitter and said transmitter transmits compensation values to said receiver over a forward control channel.

34. The method of claim 32, wherein said processing step is performed at said receiver.

35. The method of claim 32, further comprising the step of compensating said modulated signals using a memory-based predistorter.

36. The method of claim 32, wherein said digital signal is part of a signal constellation, and said method further comprises the steps of partitioning said signal constellation into a plurality of sub-constellations and performing said accumulating and processing steps for the signals within each sub-constellation.

37. An adaptive compensation system for compensating a digital signal, comprising:

a statistical accumulation circuit which accumulates statistical information at a receiver regarding a received signal transmitted by a transmitter, said accumulation involving the accumulation of a symbol cluster statistical information which is used to accumulate constellation statistical information;

a compensation value determination circuit which processes said statistical information to determine compensation values; and a compensation circuit which uses said compensation values to compensate said signal;

a constellation distortion estimation circuit which determines the constellation distortions due to at least one voltage offset, gain mismatch ratio, lock angle error, quad angle error, nonlinear channel distortions and receiver distortions;

wherein said compensation circuit compensates for said constellation distortions in at least one of the in-phase quadrature signal components of said signal; and wherein said statistical accumulation circuit further comprises a weighted sum circuit which accumulates weighted sums of the symbol coordinates to produce first, second and third matrices, a matrix inversion circuit which inverts said first matrix and multiplies said inverted first matrix by said second matrix to produce a first coefficient matrix of the coefficients for a first coordinate of the constellation used in a least squares model for estimating the center of each symbol cluster, and a multiplication circuit which multiplies said inverted first matrix by said third matrix to produce a second coefficient matrix of the coefficients for a second coordinate of the constellation used in said least squares model for estimating the center of each symbol cluster.

38. The system of claim 37, wherein weighted sum circuit operates to produce said first, second and third matrices, designated A, $B_x$ and $B_y$ in accordance with the following relationships:

$$A = \sum_{i=1}^{M} \sum_{j=1}^{M} \sum_{k=1}^{K_{ij}} \begin{vmatrix} 1 & l_{ik} & m_{jk} & l_{ik}^2 & m_{jk}^2 & l_{ik}^3 & m_{jk}^3 \\ l_{ik} & l_{ik}^2 & l_{ik}m_{jk} & l_{ik}^3 & l_{ik}m_{jk}^2 & l_{ik}^4 & l_{ik}m_{jk}^3 \\ m_{jk} & l_{ik}m_{jk} & m_{jk}^2 & l_{ik}^2 m_{jk} & m_{jk}^3 & l_{ik}^3 m_{jk} & m_{jk}^4 \\ l_{ik}^2 & l_{ik}^3 & l_{ik}^2 m_{jk} & l_{ik}^4 & l_{ik}^2 m_{jk}^2 & l_{ik}^5 & l_{ik}^2 m_{jk}^3 \\ m_{jk}^2 & l_{ik}m_{jk}^2 & m_{jk}^3 & l_{ik}^2 m_{jk}^2 & m_{jk}^4 & l_{ik}^3 m_{jk}^2 & m_{jk}^5 \\ l_{ik}^3 & l_{ik}^4 & l_{ik}^3 m_{jk} & l_{ik}^5 & l_{ik}^3 m_{jk}^2 & l_{ik}^6 & l_{ik}^3 m_{jk}^3 \\ m_{jk}^3 & l_{ik}m_{jk}^3 & m_{jk}^4 & l_{ik}^2 m_{jk}^3 & m_{jk}^5 & l_{ik}^3 m_{jk}^3 & m_{jk}^6 \end{vmatrix},$$

$$B_x = \sum_{i=1}^{M} \sum_{j=1}^{M} \sum_{k=1}^{K_{ij}} \begin{vmatrix} x_{ijk} \\ l_{ik} x_{ijk} \\ m_{jk} x_{ijk} \\ l_{ik}^2 x_{ijk} \\ m_{jk}^2 x_{ijk} \\ l_{ik}^3 x_{ijk} \\ m_{jk}^3 x_{ijk} \end{vmatrix},$$

-continued $$B_y = \sum_{i=1}^{M} \sum_{j=1}^{M} \sum_{k=1}^{K_{ij}} \begin{vmatrix} y_{ijk} \\ l_{ik} y_{ijk} \\ m_{jk} y_{ijk} \\ l_{ik}^2 y_{ijk} \\ m_{jk}^2 y_{ijk} \\ l_{ik}^3 y_{ijk} \\ m_{jk}^3 y_{ijk} \end{vmatrix}.$$

wherein 1 is defined as (i−(M+1)/2) and m is defined as (j−(M+1)/2)), M is the number of symbols in each coordinate of the constellation and i and j are integers ranging from 1 to M which indicate the location of each cluster.

39. The system of claim 38, wherein said first and second coordinate coefficient matrices are of the form:

$$P_X^T = |A_x B_{xx} B_{xy} C_{xx} C_{xy} D_{xx} D_{xy}|,$$

$$P_Y^T = |A_y B_{yx} B_{yy} C_{yx} C_{yy} D_{yx} D_{yy}|,$$

wherein $A_x$ and $A_y$ are constellation offsets in the x and y directions, respectively, $B_{xx}$ and $B_{yy}$ are the linear gains in the x and y directions, respectively, $B_{xy}$ is the linear run per unit rise, $B_{yx}$ is the linear rise per unit run, $C_{xx}$, $C_{yy}$, $D_{xx}$ and $D_{yy}$ are the nonlinear gains in the x and y directions, respectively, $C_{xy}$, $C_{yx}$, $D_{xy}$ and $D_{yy}$ are the nonlinear skews in the x and y directions respectively, and wherein said coefficients A, B, C and D are used in a higher order least squares model of the estimated cluster center locations of the following form:

$$\hat{x}_{ij} = A_x + B_{xx}(i-d) + B_{xy}(j-d) + C_{xx}(i-d)^2 + C_{xy}(j-d)^2 + D_{xx}(i-d)^3 + D_{xy}(j-d)^3,$$

$$\hat{y}_{ij} = A_y + B_{yx}(i-d) + B_{yy}(j-d) + C_{yx}(i-d)^2 + C_{yy}(j-d)^2 + D_{yx}(i-d)^3 + D_{yy}(j-d)^3.$$

40. A system for adaptively compensating a digital signal which is being transmitted by a transmitter and received by a receiver, comprising:
- a signal modulator which modulates a digital signal at the transmitter according to a predetermined modulation scheme;
- an adaptive compensation circuit which compensates said modulated signal at said transmitter in accordance with compensation values determined from statistical information accumulated at the receiver regarding the received signal;
- a transmitter for transmitting said compensated modulated signal to said receiver;
- a receiving circuit which receives said compensated modulated signal at said receiver;
- a statistical accumulation circuit which accumulates statistical information at said receiver regarding said received signal, said statistical accumulation circuit comprising
  - a symbol cluster accumulation circuit which accumulates symbol cluster statistical information and uses said symbol cluster statistical information to accumulate constellation statistical information,
  - a weighted sum circuit which accumulates weighted sums of the symbol coordinates to produce first, second and third matrices;
- an inversion circuit which inverts said first matrix and multiplies said inverted first matrix by said second matrix to produce a first coefficient matrix of the coefficients for a first coordinate of the constellation used in a least squares model for estimating the center of each symbol cluster;
- a multiplication circuit which multiplies said inverted first matrix by said third matrix to produce a second coefficient matrix of the coefficients for a second coordinate of the constellation used in said least squares model for estimating the center of each symbol cluster;
- a processing circuit which processes said statistical information to determine compensation values for constellation distortions due to at least one of voltage offset, gain mismatch ratio, lock angle error, quad angle error, nonlinear channel distortions and receiver distortions;
- wherein said adaptive compensation circuit compensates for said constellation distortions in at least one of the in-phase and quadrature signal components of said signal.

41. The system of claim 40, wherein said receiver transmits said statistical information over a reverse control channel to said transmitter and said processing circuit is located at said transmitter.

42. The system of claim 40, wherein said processing circuit is located at said receiver and said receiver transmits said compensation values to said transmitter over a reverse control channel.

43. The system of claim 40, further comprising a memory-based predistorter for predistorting said modulated signal prior to transmission.

44. The system of claim 40, wherein said digital signal is part of a signal constellation, and said system further comprises a partitioning circuit which partitions said signal constellation into a plurality of sub-constellations which are processed by said accumulation and processing circuits for the signals within each sub-constellation.

45. A system for adaptively compensating a digital signal which is being transmitted by a transmitter and received by a receiver, comprising:
- a signal modulator which modulates a digital signal at the transmitter according to a predetermined modulation scheme;
- an adaptive compensation circuit which adaptively compensates said modulated signal at said receiver in accordance with compensation values determined from statistical information accumulated at the receiver regarding the received signal;
- a transmitter for transmitting said modulated signal to said receiver;
- a receiving circuit which receives said modulated signal at said receiver;
- a statistical accumulation circuit which accumulates statistical information at said receiver regarding said received signal, said statistical accumulation circuit comprising:
  - a symbol cluster accumulation circuit which accumulates symbol cluster statistical information and uses said symbol cluster statistical information to accumulate constellation statistical information,
  - a weighted sum circuit which accumulates weighted sums of the symbol coordinates to produce first, second and third matrices;
- an inversion circuit which inverts said first matrix and multiplying said inverted first matrix by said second matrix to produce a first coefficient matrix of the coefficients for a first coordinate of the constellation used in a least squares model for estimating the center of each symbol cluster;

a multiplication circuit which multiplies said inverted first matrix by said third matrix to produce a second coefficient matrix of the coefficients for a second coordinate of the constellation used in said least squares model for estimating the center of each symbol cluster;

a processing circuit which processes said statistical information to determine compensation values for constellation distortions due to at least one of voltage offset, gain mismatch ratio, lock angle error, quad angle error, nonlinear channel distortions and receiver distortions;

wherein said adaptive compensation circuit compensates for said constellation distortions in at least one of the in-phase and quadrature signal components of said signal.

46. The system of claim 45, wherein said receiver transmits said statistical information over a reverse control channel to said transmitter, said processing circuit is located at said transmitter and said transmitter transmits compensation values to said receiver over a forward control channel.

47. The system of claim 45, wherein said processing circuit is located at said receiver.

48. The system of claim 45, further comprising a memory-based predistorter for predistoring said modulated signal prior to transmission.

49. The system of claim 45, wherein said digital signal is part of a signal constellation, and said system further comprises a partitioning circuit which partitions said signal constellation into a plurality of sub-constellations which are processed by said accumulation and processing circuits for the signals within each sub-constellation.

50. A method for adaptively compensating a digital signal, comprising the following steps:

accumulating statistical information at a receiver regarding a received signal transmitted by a transmitter, said accumulating step comprising the further steps of accumulating symbol cluster statistical information, using said symbol cluster statistical information to accumulate constellation statistical information, accumulating weighted sums of the symbol coordinates to produce first, second and third matrices, inverting said first matrix and multiplying said inverted first matrix by said second matrix to produce a first coefficient matrix of the coefficients for a first coordinate of the constellation used in a least squares model for estimating the center of each symbol cluster, multiplying said inverted first matrix by said third matrix to produce a second coefficient matrix of the coefficients for a second coordinate of the constellation used in said least squares model for estimating the center of each symbol cluster;

processing said statistical information to determine compensation values; and using said compensation values to compensate said signal.

51. The method of claim 50, wherein said digital signal includes at least one QAM (quadrature amplitude modulation), TCM (trellis coded modulation), CAP (carrierless AM/PM), MPSK (multiple phase shifting keying), QPR (quadrature partial response) and signal constellations.

52. The method of claim 50, wherein said step of accumulating constellation statistical information and said processing step are used to determine predistortion parameters, said method comprising the further step of using said predistortion parameters to predistort said signal prior to transmission of said signal, whereby said received signal symbol clusters are properly located in accordance with predetermined signal decision boundaries.

53. The method of claim 50, further comprising the following steps:

transmitting from said receiver to a transmitter which transmitted said digital signals received at said receiver, statistical and control information indicative of the distortions in the received signals; and processing said statistical and control information to determine at least one type, magnitude and direction of compensating predistortions which may be applied at the transmitter to predistort said signal prior to its transmission, whereby the received signal at the receiver will have substantially no distortions.

54. The method of claim 50, further comprising the following steps:

using a memory-based predistorter to compensate said signal;

determining any residual nonlinear distortion still present in said signal; and if so, adaptively predistorting said signal to substantially eliminate said residual nonlinear distortion.

* * * * *

UNITED STATES PATENT AND TRADEMARK OFFICE
CERTIFICATE OF CORRECTION

PATENT NO.    : 6,252,912 B1
DATED         : June 26, 2001
INVENTOR(S)   : Sheldon N. Salinger It is certified that error appears in the above-identified patent and that said Letters Patent is hereby corrected as shown below:

Column 4,
Line 16, delete "$M^{K^-}1$" and insert -- $M^{K-1}$ --

Column 8,
Line 8, delete "$(X_{ij},y_{ij})$" and insert -- $(x_{ij},y_{ij})$ --
Line 50, insert -- , -- between " $\hat{y}_{ij}$ " and "we"
Line 50, delete "$\{Y_{ijk}\}$" and insert -- $\{y_{ijk}\}$ --

Column 9,
Line 14, insert -- , -- between " $D_{yij}$ " and "the"

Column 10,
Line 45, delete "$m_j$-d," and insert -- $m_j$=j-d, --

Column 12,
Line 66, delete "$\Psi_x = -\tan_{-1}(B_{yx}/B_{xx})$" and insert -- $\Psi_x = -\tan^{-1}(B_{yx}/B_{xx})$ --

Column 14,
Line 60, delete ", and γ y and β" and insert -- , and γ and β --

Column 16,
Line 52, delete "$(\hat{x}'_{ij'k}, \hat{y}'_{ij'k})$" and
insert -- $(\hat{x}'_{ij'k}, \hat{y}'_{ij'k})$ --

Line 62 (Fig. 34b), delete " $\hat{x}'_{211} = \hat{x}_{23},$ " and
insert -- $\hat{x}'_{211} = \hat{x}_{32},$ --

Column 17,
Line 7 (Fig. 35c), delete " $E_{yxi} = \hat{y}'_{21k} - \hat{y}'_{22k} = \hat{y}'_{22k} - \hat{y}'_{12k}$ "
and insert -- $E_{yxi} = \hat{y}'_{21k} - \hat{y}'_{11k} = \hat{y}'_{22k} - \hat{y}'_{12k}$ --

Line 25, delete "$A_x$ and $A_Y$" and insert -- $A_x$ and $A_y$ --

UNITED STATES PATENT AND TRADEMARK OFFICE
CERTIFICATE OF CORRECTION

PATENT NO. : 6,252,912 B1
DATED : June 26, 2001
INVENTOR(S) : Sheldon N. Salinger It is certified that error appears in the above-identified patent and that said Letters Patent is hereby corrected as shown below:

<u>Column 25,</u>
Line 28, delete "$D_{yy}$" and insert -- $D_{yx}$ --

Signed and Sealed this

Twelfth Day of March, 2002

*Attest:*

*Attesting Officer*

JAMES E. ROGAN
*Director of the United States Patent and Trademark Office*